(12) United States Patent
Chuang et al.

(10) Patent No.: US 10,748,730 B2
(45) Date of Patent: Aug. 18, 2020

(54) PHOTOCATHODE INCLUDING FIELD EMITTER ARRAY ON A SILICON SUBSTRATE WITH BORON LAYER

(71) Applicant: KLA-Tencor Corporation, Milpitas, CA (US)

(72) Inventors: Yung-Ho Alex Chuang, Cupertino, CA (US); John Fielden, Los Altos, CA (US); Yinying Xiao-Li, San Jose, CA (US); Xuefeng Liu, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 397 days.

(21) Appl. No.: 15/160,505

(22) Filed: May 20, 2016

(65) Prior Publication Data

US 2016/0343532 A1 Nov. 24, 2016

Related U.S. Application Data

(60) Provisional application No. 62/164,975, filed on May 21, 2015.

(51) Int. Cl.
*H01J 1/308* (2006.01)
*H01L 31/105* (2006.01)
(Continued)

(52) U.S. Cl.
CPC ............ *H01J 1/308* (2013.01); *H01J 1/3044* (2013.01); *H01J 1/34* (2013.01);
(Continued)

(58) Field of Classification Search
None
See application file for complete search history.

(56) References Cited

U.S. PATENT DOCUMENTS 3,755,704 A 8/1973 Spindt et al.
3,870,917 A 3/1975 Cuny
(Continued)

FOREIGN PATENT DOCUMENTS

EP 746871 5/2000
EP 602983 6/2000
(Continued)

OTHER PUBLICATIONS

Kenneth W. Tobin Inspection in Semiconductor Manufacturing Webster's Encyclopedia of Electrical and Electronic Engineering, vol. 10, pp. 242-262, Wiley & Sons, NY, NY, 1999.
(Continued)

*Primary Examiner* — Ermias T Woldegeorgis
(74) *Attorney, Agent, or Firm* — Bever, Hoffman & Harms, LLP

(57) ABSTRACT

A photocathode utilizes an field emitter array (FEA) integrally formed on a silicon substrate to enhance photoelectron emissions, and a thin boron layer disposed directly on the output surface of the FEA to prevent oxidation. The field emitters are formed by protrusions having various shapes (e.g., pyramids or rounded whiskers) disposed in a two-dimensional periodic pattern, and may be configured to operate in a reverse bias mode. An optional gate layer is provided to control emission currents. An optional second boron layer is formed on the illuminated (top) surface, and an optional anti-reflective material layer is formed on the second boron layer. An optional external potential is generated between the opposing illuminated and output surfaces. An optional combination of n-type silicon field emitter and p-i-n photodiode film is formed by a special doping scheme and by applying an external potential. The photocathode forms part of sensor and inspection systems.

27 Claims, 12 Drawing Sheets

(51) Int. Cl.
- *H01L 31/107* (2006.01)
- *H01L 27/148* (2006.01)
- *H01J 1/304* (2006.01)
- *H01J 1/34* (2006.01)

(52) U.S. Cl.
CPC ...... *H01L 27/14831* (2013.01); *H01L 31/105* (2013.01); *H01L 31/107* (2013.01); *H01J 2201/3423* (2013.01)

(56) References Cited

U.S. PATENT DOCUMENTS

| | | | |
|---|---|---|---|
| 3,947,707 | A | 3/1976 | Shannon |
| 4,099,198 | A | 7/1978 | Howorth et al. |
| 4,210,922 | A | 7/1980 | Shannon |
| 4,275,326 | A | 6/1981 | Houtkamp |
| 4,348,690 | A | 9/1982 | Jastrzebski |
| 4,467,189 | A | 8/1984 | Tsuchiya |
| 4,555,731 | A | 11/1985 | Zinchuk |
| 4,760,031 | A | 7/1988 | Janesick |
| 5,054,683 | A | 10/1991 | Haisma et al. |
| 5,120,949 | A | 6/1992 | Tomasetti |
| 5,144,630 | A | 9/1992 | Lin |
| 5,227,313 | A | 7/1993 | Gluck et al. |
| 5,315,126 | A | 5/1994 | Field |
| 5,363,021 | A * | 11/1994 | MacDonald ............ H01J 3/022 250/396 R |
| 5,376,810 | A | 12/1994 | Hoenk et al. |
| 5,563,702 | A | 10/1996 | Emery et al. |
| 5,717,518 | A | 2/1998 | Shafer et al. |
| 5,719,069 | A | 2/1998 | Sparks |
| 5,731,584 | A | 3/1998 | Beyne |
| 5,742,626 | A | 4/1998 | Mead et al. |
| 5,760,899 | A | 6/1998 | Eismann |
| 5,852,322 | A | 12/1998 | Speckbacher |
| 5,940,685 | A | 8/1999 | Loomis et al. |
| 5,999,310 | A | 12/1999 | Shafer et al. |
| 6,013,399 | A | 1/2000 | Nguyen |
| 6,162,707 | A | 12/2000 | Dinh |
| 6,201,257 | B1 * | 3/2001 | Stettner ................. B82Y 10/00 257/10 |
| 6,201,601 | B1 | 3/2001 | Vaez-Iravani et al. |
| 6,220,914 | B1 | 4/2001 | Lee et al. |
| 6,271,916 | B1 | 8/2001 | Marxer et al. |
| 6,278,119 | B1 | 8/2001 | Nikzad et al. |
| 6,285,018 | B1 | 9/2001 | Aebi et al. |
| 6,297,879 | B1 | 10/2001 | Yang et al. |
| 6,307,586 | B1 | 10/2001 | Costello |
| 6,346,700 | B1 | 2/2002 | Cunningham et al. |
| 6,362,484 | B1 | 3/2002 | Beyne |
| 6,373,869 | B1 | 4/2002 | Jacob |
| 6,403,963 | B1 | 6/2002 | Nikzad et al. |
| 6,535,531 | B1 | 3/2003 | Smith et al. |
| 6,545,281 | B1 | 4/2003 | McGregor |
| 6,608,676 | B1 | 8/2003 | Zhao et al. |
| 6,711,283 | B1 | 3/2004 | Soenksen |
| 6,837,766 | B2 | 1/2005 | Costello |
| 7,005,637 | B2 | 2/2006 | Costello et al. |
| 7,039,157 | B2 | 5/2006 | Fuji et al. |
| 7,126,699 | B1 | 10/2006 | Wihl |
| 7,130,039 | B2 | 10/2006 | Vaez-Iravani et al. |
| 7,283,166 | B1 | 10/2007 | Billman |
| 7,313,155 | B1 | 12/2007 | Mu et al. |
| 7,321,468 | B2 | 1/2008 | Herkommer et al. |
| 7,345,825 | B2 | 3/2008 | Chuang et al. |
| 7,352,457 | B2 | 4/2008 | Kvamme et al. |
| 7,432,517 | B2 | 10/2008 | Botma et al. |
| 7,446,474 | B2 | 11/2008 | Maldonado |
| 7,465,935 | B2 | 12/2008 | Urano et al. |
| 7,525,649 | B1 | 4/2009 | Leong et al. |
| 7,528,943 | B2 | 5/2009 | Brown et al. |
| 7,586,108 | B2 | 9/2009 | Nihtianov et al. |
| 7,609,309 | B2 | 10/2009 | Brown et al. |
| 7,741,666 | B2 | 6/2010 | Nozaki et al. |
| 7,750,280 | B2 | 7/2010 | Hwang et al. |
| 7,791,170 | B2 | 9/2010 | Chiang et al. |
| 7,800,040 | B2 | 9/2010 | Blacksberg et al. |
| 7,813,406 | B1 | 10/2010 | Nguyen et al. |
| 7,928,382 | B2 | 4/2011 | Hatakeyama et al. |
| 7,952,633 | B2 | 5/2011 | Brown et al. |
| 7,985,658 | B2 | 7/2011 | Lei et al. |
| 7,999,342 | B2 | 8/2011 | Hsu et al. |
| 8,017,427 | B2 | 9/2011 | Manabe |
| 8,138,485 | B2 | 3/2012 | Nihtianov et al. |
| 8,309,443 | B2 | 11/2012 | Tanaka et al. |
| 8,450,820 | B2 | 5/2013 | Nanver |
| 8,455,971 | B2 | 6/2013 | Chen et al. |
| 8,513,587 | B2 | 8/2013 | Wang et al. |
| 8,629,384 | B1 | 1/2014 | Biellak et al. |
| 8,665,536 | B2 | 3/2014 | Armstrong |
| 8,755,417 | B1 | 6/2014 | Dribinski |
| 8,873,596 | B2 | 10/2014 | Dribinski |
| 8,891,079 | B2 | 11/2014 | Zhao et al. |
| 8,896,917 | B2 | 11/2014 | Armstrong |
| 8,929,406 | B2 | 1/2015 | Chuang et al. |
| 8,976,343 | B2 | 3/2015 | Genis |
| 9,055,246 | B2 | 6/2015 | Tay |
| 2001/0017344 | A1 | 8/2001 | Aebi |
| 2002/0191834 | A1 | 12/2002 | Fishbaine |
| 2003/0222579 | A1 | 12/2003 | Habib et al. |
| 2004/0021061 | A1 | 2/2004 | Bijkerk |
| 2004/0056279 | A1 | 3/2004 | Niigaki |
| 2004/0227070 | A1 | 11/2004 | Bateman et al. |
| 2005/0167575 | A1 | 8/2005 | Benz et al. |
| 2005/0264148 | A1 | 12/2005 | Maldonado et al. |
| 2006/0054778 | A1 | 3/2006 | Suhling |
| 2006/0055321 | A1 | 3/2006 | Maldonado et al. |
| 2006/0069460 | A1 | 3/2006 | Smith et al. |
| 2006/0170324 | A1 | 8/2006 | Machuca |
| 2007/0002465 | A1 | 1/2007 | Chuang et al. |
| 2007/0034987 | A1 | 2/2007 | Costello et al. |
| 2007/0103769 | A1 | 5/2007 | Kuwabara |
| 2007/0291810 | A1 | 12/2007 | Luo et al. |
| 2008/0044932 | A1 | 2/2008 | Samoilov et al. |
| 2008/0173903 | A1 | 7/2008 | Imai et al. |
| 2008/0182092 | A1 | 7/2008 | Bondokov et al. |
| 2008/0267241 | A1 | 10/2008 | Brown et al. |
| 2008/0315092 | A1 | 12/2008 | Kley |
| 2008/0315121 | A1 | 12/2008 | Nihtianov et al. |
| 2009/0021717 | A1 | 1/2009 | Nihtianov et al. |
| 2009/0091752 | A1 | 4/2009 | Terasawa et al. |
| 2009/0125242 | A1 | 5/2009 | Choi |
| 2009/0168152 | A1 | 7/2009 | Gelernt et al. |
| 2009/0180176 | A1 | 7/2009 | Armstrong et al. |
| 2009/0128912 | A1 | 9/2009 | Okada |
| 2010/0102213 | A1 | 4/2010 | Garris |
| 2010/0148667 | A1 | 6/2010 | Nigaki et al. |
| 2010/0188655 | A1 | 7/2010 | Brown et al. |
| 2010/0194956 | A1 | 8/2010 | Yuan et al. |
| 2010/0301437 | A1 | 12/2010 | Brown et al. |
| 2011/0073982 | A1 | 3/2011 | Armstrong et al. |
| 2011/0101219 | A1 | 5/2011 | Uchiyama et al. |
| 2011/0116077 | A1 | 5/2011 | Chuang et al. |
| 2011/0169116 | A1 | 7/2011 | Nanver et al. |
| 2011/0234790 | A1 | 9/2011 | True |
| 2011/0256655 | A1 | 10/2011 | Nikzad et al. |
| 2011/0261354 | A1 | 10/2011 | Sinfield |
| 2011/0291109 | A1 | 12/2011 | Wraback |
| 2012/0012811 | A1 | 1/2012 | DeFlumere |
| 2012/0012957 | A1 | 1/2012 | Larsen |
| 2012/0034816 | A1 | 2/2012 | Woods |
| 2012/0038809 | A1 | 2/2012 | Lee et al. |
| 2012/0081684 | A1 | 4/2012 | Den Oef et al. |
| 2012/0132823 | A1 | 5/2012 | Menge |
| 2012/0160993 | A1 | 6/2012 | Nevet |
| 2012/0170021 | A1 | 7/2012 | Walsh |
| 2012/0200216 | A1 | 8/2012 | Okazaki et al. |
| 2012/0228485 | A1 | 9/2012 | Iwakiri et al. |
| 2012/0268722 | A1 | 10/2012 | Nihtianov et al. |
| 2013/0015324 | A1 | 1/2013 | Park et al. |
| 2013/0016346 | A1 | 1/2013 | Romanovsky et al. |
| 2013/0017205 | A1 | 1/2013 | Giaccia et al. |
| 2013/0082241 | A1 | 4/2013 | Kub et al. |
| 2013/0088706 | A1 | 4/2013 | Chuang et al. |

(56) References Cited

U.S. PATENT DOCUMENTS

| | | | |
|---|---|---|---|
| 2013/0148112 A1 | 6/2013 | Chuang et al. | |
| 2013/0056843 A1 | 7/2013 | Lee | |
| 2013/0176552 A1 | 7/2013 | Brown et al. | |
| 2013/0194445 A1 | 8/2013 | Brown et al. | |
| 2013/0264481 A1 | 10/2013 | Chern et al. | |
| 2013/0270663 A1 | 10/2013 | Lin et al. | |
| 2013/0313440 A1 | 11/2013 | Chuang et al. | |
| 2013/0320211 A1 | 12/2013 | Park et al. | |
| 2014/0034816 A1* | 2/2014 | Chuang | H01J 29/385 250/216 |
| 2014/0111799 A1 | 4/2014 | Lei et al. | |
| 2014/0158864 A1 | 6/2014 | Brown et al. | |
| 2014/0203386 A1 | 7/2014 | Bui | |
| 2014/0204963 A1 | 7/2014 | Chuang et al. | |
| 2014/0226140 A1 | 8/2014 | Chuang et al. | |
| 2014/0246595 A1 | 9/2014 | Menge | |
| 2014/0291493 A1* | 10/2014 | Chuang | H01L 31/103 250/216 |
| 2014/0305367 A1 | 10/2014 | Chuang et al. | |
| 2014/0362203 A1 | 12/2014 | Delaney | |
| 2015/0007765 A1 | 1/2015 | Dribinski | |
| 2015/0177159 A1 | 6/2015 | Brown et al. | |
| 2015/0268176 A1 | 9/2015 | Deng et al. | |
| 2015/0275393 A1 | 10/2015 | Bondokov et al. | |
| 2015/0294998 A1 | 10/2015 | Nihtianov | |
| 2016/0056606 A1 | 2/2016 | Chuang et al. | |

FOREIGN PATENT DOCUMENTS

| | | |
|---|---|---|
| EP | 1939917 A2 | 7/2008 |
| EP | 2346094 A1 | 7/2011 |
| JP | H0511287 | 1/1993 |
| JP | H08241977 A | 9/1996 |
| JP | 10-171965 A | 6/1998 |
| JP | 2002033473 | 1/2002 |
| JP | 2003043533 | 2/2003 |
| JP | 2004-031452 A | 1/2004 |
| JP | 2007040909 A | 2/2007 |
| JP | 200786108 | 4/2007 |
| JP | 2007249092 | 9/2007 |
| JP | 2007298932 | 11/2007 |
| JP | 2009-117454 A | 5/2009 |
| KR | 100688497 | 3/2007 |
| KR | 100826407 | 5/2008 |
| RU | 2297070 C2 | 4/2007 |
| WO | 1995032518 A1 | 11/1995 |
| WO | 1996017372 A1 | 6/1996 |
| WO | 2007035858 A2 | 3/2007 |
| WO | 2008121232 A1 | 10/2008 |
| WO | 2011091159 | 7/2011 |
| WO | 2013006867 A1 | 1/2013 |
| WO | 2014/067754 A2 | 5/2014 |

OTHER PUBLICATIONS

Stevanovic, A CMOS Image Sensor for High-Speed Imaging, 2000 IEEE int'l. Solid-State Circuits Conf., 3 pgs.

Sobieski, Stanley, "Intensified Charge Coupled Devices for Ultra Low Light Level Imaging", NASA, Goddard Space Flight Center, SPIE vol. 78 (1976) Low Light Level Devices, pp. 73-77.

Paetzel, Activation of Silicon Wafer by Excimer Laser, 18th IEEE Conf. Advanced Thermal Processing of Semiconductors—RTP 2010, 5 pgs.

Fu, Xiaoqian, "Higher Quantum Efficiency by Optimizing GaN Photocathode Structure", 978-1-4244-6644-3/10/ © 2010 IEEE, pp. 234-235.

Nanver, Lis K. "Silicon Photodiodes for Low Penetration Depth Beams such as DUV/VUV/EUV Light and Low Energy Electrons", Advances in Photodiodes, G. Betta, ed., Mar. 22, 2011, pp. 205-224, www.intechopen.com.

Sarubbi, F. et al. "Chemical Vapor Deposition of α-Boron Layers on Silicon for Controlled Nanometer-Deep p+ n Junction Formation", J. Electron. Mat., vol. 39, No. 2, Feb. 2010, pp. 162-173.

Nanver, Lis K. et al. "Pure-Boron Chemical-Vapor-Deposited Layers: a New Material for Silicon Device Processing", 18th IEEE International Conference on Advanced Thermal Processing of Semiconductors (RTP), Sep. 28, 2010-Oct. 1, 2010, pp. 136-139.

Hecht, Eugene, Optics, 2nd Edition, Adelphi University, 1987, Addison-Wesley Publishing Co., Inc., 3 pages.

Hecht, Eugene, Optics, 4th Edition, India: Pearson Education Pte, Ltd. reprint 2004, 4 pages.

Martinelli, Ramon U. "Infrared Photoemission from Silicon", Applied Physics Letters, vol. 16, No. 7, Apr. 1, 1970, pp. 261-262.

Martinelli, Ramon U. "Reflection and Transmission Secondary Emission from Silicon", Applied Physics Letters, vol. 17, No. 8, Oct. 15, 1970, pp. 313-314.

Henderson, Brian S. "Study of Negative Electron Affinity GaAs Photocathodes", Department of Physics and Astronomy, Rice University, Houston, TX, Aug. 7, 2009, 18 pages.

Allen, F. G. et al. "Work Function, Photoelectric Threshold, and Surface States of Atomically Clean Silicon", Physical Review, vol. 127, No. 1, Jul. 1, 1962, pp. 150-158.

Howorth, J. R. et al. "Transmission silicon photoemitters and electron multipliers," Journal of Physics D: Applied Physics, vol. 9, No. 5, Apr. 1, 1976, pp. 785-794.

Fu et al. "Optimizing GaN photocathode structure for higher quantum efficiency", Optik, vol. 123, No. 9, May 2012, pp. 756-768.

Sarubbi F et al: "Pure boron-doped photodiodes: a solution for radiation detection in EUV lithography", Proceedings of the 38th European Solid-State Device Research Conference: Edinburgh International Conference Centre, Endiburgh, Scotland, UK, Sep. 15-19, 2008, Piscataway, NJ: IEEE, US, Sep. 15, 2008, pp. 278-281.

Raoult, F. et al., "Efficient generation of narrow-bandwidth picosecond pulses by frequency doubling of femtosecond chirped pulses", Jul. 15, 1998 / ol. 23, No. 14 / Optics Letters, pp. 1117-1119.

Sakic, Agata, "Boron-layer silicon photodiodes for high-efficiency low-energy electron detection", Solid-State Electronics 65-66 (2011), pp. 38-44.

Omatsu, Takashige et al., "High repetition rate Q-switching performance in transversely diode-pumped Nd doped mixed gadolinium yttrium vanadate bounce laser", Optics Express vol. 14, Issue 7, pp. 2727-2734, Apr. 3, 2006.

Nihtianov, 61/720700—Certified Copy corres to PCT/EP2013/071080, pp. 1-44.

Fanton, J. T., et al., "Multiparameter Measurements of Thin Films Using beam-profile reflectometry", Journal of Applied Physics, vol. 73, No. 11, p. 7035 (1993).

Leng, et al., "Simultaneous Measurement of Six Layers in a Silicon on Insulator Film Stack Using Spectrophotometry and Beam Profile Reflectometry," , Journal of Applied Physics, vol. 81, No. 8, p. 3570 (1997).

Huang, Back-Side Illuminated Photogate CMOS . . . , IEEE Sensors Journal, vol. 11, No. 9, Sep. 2011, 5 pgs.

Nikzad, Delta-doped CCDs High QE with long-term stability . . . ; SPIE vol. 2198 (1994) pp. 907-915.

Niclass, Design and Characterization of a CMOS 3-D . . . , IEEE Journal Solid-State Circuits, vol. 40, No. 9, Sep. 2005, 8 pgs.

Herriott, Folded Optical Delay Lines, Applied Optics 4, #8, pp. 883-889 (1965).

Itzler, InP-based Geiger-mode . . . , Proc. SPIE vol. 7320 (2000), 12 pgs.

Grubisic, New Silicon Reach-Through Avalanche . . . , MIPRO 2013, May 20-24, 2013, pp. 48-54.

Dulinski, Tests of a backside illuminated monolithic Cmos pixel . . . , Nuclear Instruments and Methods in Physics Research A 546 (2005) 274-280, 7 pgs.

Armstrong, The Quest for the Ultimate Vacuum Tube, Spectrum IEEE, Dec. 2015, 4 pgs.

Ding, Field Emission from Silicon, MIT 2001, 277 pgs.

Unknown, Field Emitter Review, 7 pgs in Japanese.

Koike, Field Emitter Equipped With a Suppressor to Control Emission Angel, IEEE Electron Device Letters, vol. 34, No. 5, May 2013, 3 pgs.

Nagao, Cathod Technologies for Field Emission Displays, IEJ Trans 2006; 1:171-178, 8 pgs.

(56) References Cited

OTHER PUBLICATIONS

Nagao, Fabrication of a Field Emitter Array with a Built-In Einzel Lens, JJAP 48 (2008) 06FK02, 4 pgs.

Neo, Electron Optical Properties of Microcolumn with Field Emitter, JJAP 52 (2013) 036603, 5 pgs.

Rakhshandehroo, Fabrication of a self-aligned silicon field emission . . . , JVSTB, 16, 765 (1998); doi: 10.1116/1,589900, 6 pgs.

Rakhshandehroo, Field emission from gated Si emitter tips with precise . . . , JVSTB, 15, 2777 (1997); doi: 10.1116/1.589726, 6 pgs.

SATO, Fabrication and characterization of HfC coated . . . , J. Vac. Sci. Technol. B 2194), published Jul. 31, 2003, 5 pgs.

Serbun, Stable field emission of single B-doped . . . , JVSTB, 31, 02B101 (2013); doi: 10.1116/1.4765088, 7 pgs.

Fowler, Electron Emission in Intense Electric Fields, Mar. 31, 1928, 9 pgs.

Utsumi, Vacuum Microelectrnoics: What's New and Exciting, IEEE vol. 38, No. 10, Oct. 1991, 8 pgs.

Herriott, Off-Axis Paths . . . , Applied Optics 3, #4, pp. 523-526 (1964).

KLA-Tencor Corporation, filed U.S. Appl. No. 62/059,368, filed Oct. 3, 2014 and entitled "183nm Laser and Inspection System".

* cited by examiner

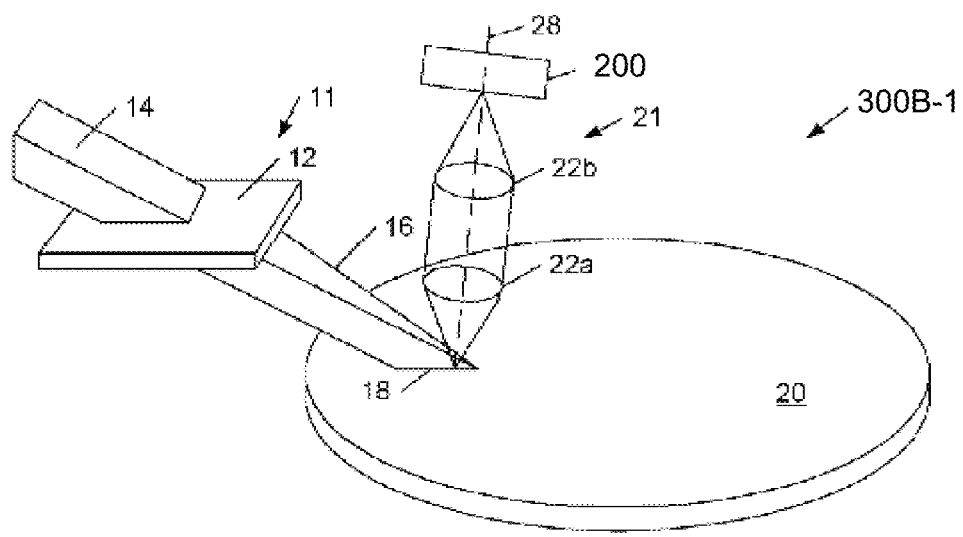
FIG. 8(A)
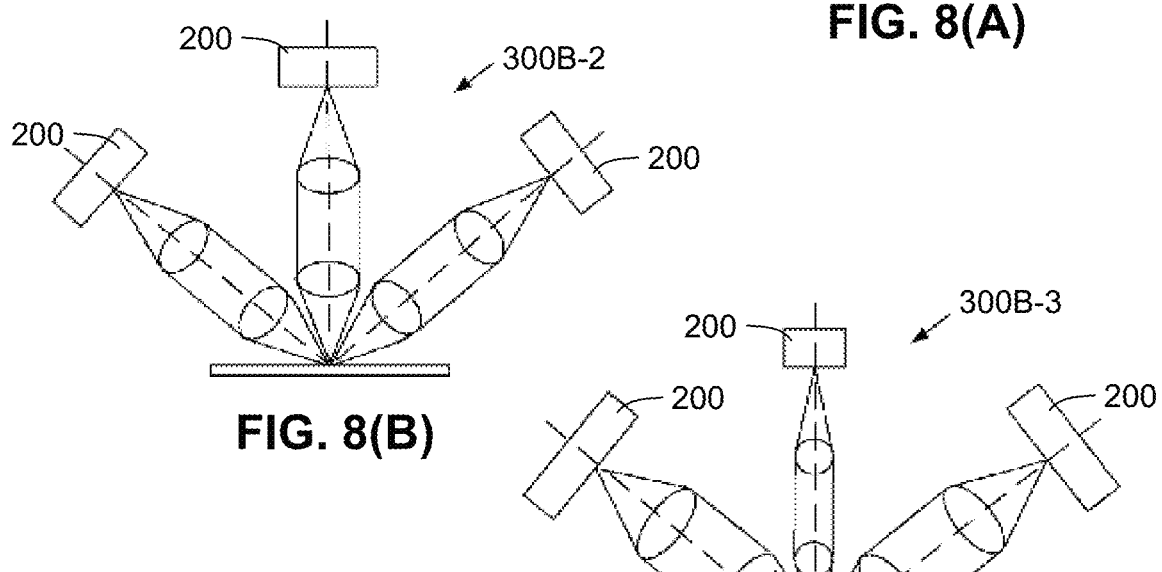
FIG. 8(B)
FIG. 8(C)
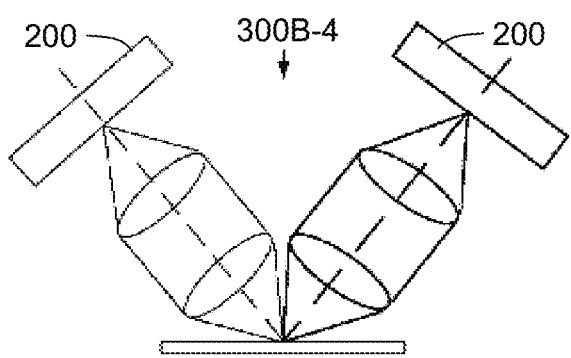
FIG. 8(D)

PHOTOCATHODE INCLUDING FIELD EMITTER ARRAY ON A SILICON SUBSTRATE WITH BORON LAYER

PRIORITY APPLICATION

This application claims priority to U.S. Provisional Patent Application 62/164,975, filed May 21, 2015, entitled "PHOTOCATHODE INCLUDING FIELD EMITTER ARRAY ON A SILICON SUBSTRATE WITH BORON LAYER", and incorporated by reference herein.

RELATED APPLICATIONS

This application is related to U.S. patent application Ser. No. 14/198,175 (published as 2014/0291493), entitled "Photomultiplier Tube, Image Sensor, and an Inspection System Using a PMT or Image Sensor", and filed by Chuang et al. on Mar. 5, 2014, and to U.S. patent application Ser. No. 13/947,975 (published as 2014/0034816), entitled "Photocathode Including Silicon Substrate with Boron Layer" and filed by Chuang et al. on Jul. 22, 2013. Both of these applications are included by reference herein.

BACKGROUND OF THE INVENTION

Field of the Invention

The present invention generally relates to low light sensing detectors (sensors) used in conjunction with semiconductor wafer, reticle or photomask inspection systems, and more particularly to photocathodes utilized in the sensors for such inspection systems.

Description of the Related Art

Photocathodes are negatively charged electrodes typically used in light detection devices such as photomultipliers, image intensifiers and electron-bombarded CCDs (EBCCDs). Photocathodes comprise a photosensitive compound that, when struck by a quantum of light (photon), generates one (or more) electrons in response to each absorbed photon due to the photoelectric effect. The photosensitive compound used in modern photocathodes typically comprises alkali metals because their low work-functions allow electrons to escape easily from the photocathode for detection by other structures of the host image sensor device. Compound semiconductors such as GaAs and InGaAs are also used to make photocathodes, particularly for infra-red sensitive devices. Silicon photocathodes have been made in the past, but have not found significant commercial use because, although silicon is efficient at capturing light, few of the generated electrons are able to escape from the silicon, resulting in low overall efficiency.

Photocathodes are generally divided into two broad groups: transmission photocathodes and reflection photocathodes. A transmission photocathode is typically formed on the surface of a window (e.g., glass) that faces the source of light to be measured, and electrons exiting the photocathode pass through the photocathode's output surface for detection (i.e., the electrons move away from the light source). A reflective photocathode is typically formed on an opaque metal electrode base, where the light enters and the electrons exit from the same "illuminated" surface. Although reflection photocathodes simplify some of the tradeoffs between photocathode thickness and sensitivity that are discussed below, they are not suitable for use in imaging devices such as image intensifiers and EBCCD devices (although they can be suitable for use in some photomultiplier configurations). Therefore, in the discussion below, the term "photocathode" refers to transmission photocathodes only, unless otherwise specified.

Photocathodes are typically formed or mounted on a suitable host sensor's housing (e.g., a vacuum tube), and the sensor housing is positioned with the illuminated surface facing a target light source (i.e., such that the photocathode is positioned between the light source and the electron-measuring structures of the host sensor). When photons are absorbed by a photocathode, on average about 50% of the generated electrons will travel towards the illuminated side of the photocathode (i.e., the side facing the light source through which the photons enter the photocathode). The other 50% of the photoelectrons will travel to the photocathode's output surface and, if the photoelectrons have sufficient energy, will be emitted toward the sensor's electron-measuring structures. When an electron is emitted from the output surface of the photocathode, it will usually be accelerated by electric fields within the host sensor toward an anode, producing corresponding measurable voltages or currents that indicate the capture of one or more photons.

Photomultipliers are vacuum phototubes including a photocathode, an anode, and a series of dynodes (electrodes), where each dynode is at a successively more positive electrical potential than its predecessor, with the anode at a positive potential higher than that of the last dynode. A photoelectron emitted from the photocathode is accelerated by the photocathode-dynode electric field and will usually strike a dynode, which causes multiple secondary electrons to be emitted that are accelerated by the subsequent dynode-to-dynode electric field. Almost all of these secondary electrons will strike another dynode and generate yet more electrons. Eventually the electrons will arrive at the anode, usually after multiple stages of amplification by multiple dynodes. A photomultiplier therefore generates a pulse of current (i.e., a charge) every time a photon is absorbed and emits a photoelectron in the correct direction. Because the generated charge is equal to the charge on many electrons, when the gain is high enough it is possible to generate a charge that is above the noise level of the electronics. Photomultipliers can be therefore extremely sensitive detectors of light in the ultraviolet, visible, and near-infrared ranges of the electromagnetic spectrum. These detectors multiply the current produced by incident light by as much as 100 million times, in multiple dynode stages, enabling (for example) individual photons to be detected when the incident flux of light is very low.

An image intensifier is another type of vacuum tube sensor device that utilizes a phosphor to increase the intensity of detected light in an optical system in order to facilitate, for example, visual imaging of low-light processes, or for conversion of non-visible light sources such as near-infrared or short wave infrared to visible. In typical image intensifiers, the photoelectrons emitted from a photocathode are accelerated toward a transparent anode coated with the phosphor such that the photoelectrons strike the phosphor with high energy (typically about 1 keV to about 20 keV), causing the phosphor to generate many photons. In some image intensifiers a microchannel plate is placed between the photocathode and phosphor in order to generate multiple secondary electrons from each photoelectron. Even without a microchannel plate, multiple photons can be generated at the output of an image intensifier for each absorbed photon. The emitted photons are directed by optics (such as a fiber optic bundle or lenses) to an image sensor.

Since each absorbed photon can generate many output photons, very low light levels can be detected and measured, potentially even single photons under some conditions.

An EBCCD is anther sensor operates in a similar manner to an image intensifier. Instead of a phosphor screen as the output, an image sensor such as a CCD is used to detect the electrons that are emitted from a photocathode and accelerated by an electric field. In an EBCCD it is typical to use a potential difference of about 2 kV or more to generate the electric field between the photocathode and the CCD, whereby photoelectrons emitted by the photocathode are accelerated and strike the CCD with high energy, generating multiple electrons inside the CCD, which are then captured. Because multiple electrons are generated for each photon that is detected, the readout and dark noise of the CCD is less important than it would be for direct detection of photons. As compared with an image intensifier, the EBCCD avoids the cost of the optics needed to transfer the light from the phosphor to the image sensor, and also avoids the degradation in image resolution caused by those optics.

FIG. 12 shows a conventional EBCCD 50 comprising a housing 52 including a window 53, a photocathode 54 disposed on an inside surface of window 53, and a charge-coupled device (CCD) 55 disposed at a lower end of housing 52 such that photocathode 54 is separated from CCD 55 by a vacuum gap 56. An electric field is generated between the photocathode 54 and the CCD 55 by applying a voltage to the photocathode that is negative with respect to that of the CCD. An incoming photon 61 enters through window 53 and is absorbed by photocathode 54, causing a photoelectron to be generated. When a photoelectron 62 has sufficient energy to escape through the output side of photocathode 54 (i.e., downward in the figure), it enters gap region 56. Because CCD 55 is at a positive potential, usually of 2 kV or more, relative to photocathode 54, photoelectron 62 is accelerated towards CCD 55 such that it achieves an energy greater than about 2 keV, whereby photoelectrons will typically generate multiple electrons inside CCD 55. The electrons generated inside CCD 55 are then transmitted (e.g., by way of pins 57) to a processing system (not shown) that is configured to generate an associated image or other data associated with the detected photoelectrons.

Prior-art photocathodes require difficult tradeoffs between conflicting requirements associated with absorbing photons and emitting photoelectrons. A good photocathode needs to have a high probability of absorbing photons at wavelengths of interest, and a high probability of generating one (or more) photoelectrons from that absorbed photon. A good photocathode also needs to have a high probability that any photoelectron generated by an absorbed photon escapes from the photocathode. A thicker photocathode increases the probability that an incident photon will be absorbed, but also increases the probability that the resulting emitted photoelectron will recombine (i.e., be lost) before it escapes. More specifically, recombinations usually occur at defects or impurities in the material forming a photocathode, so the longer the distance the photoelectron must travel through the photocathode material, the greater the probability that it will encounter a defect or impurity and be recombined. The material must have a low work-function because only photoelectrons with energy close to, or greater than, the work-function have a reasonable probability of escaping.

Typically photocathodes are optimized for a relatively narrow range of wavelengths. For example, UV wavelengths are particularly useful in the semiconductor industry for detecting small particles and defects on semiconductor wafers because in general the amount of light scattered from a small particle depends, among other factors, on the ratio of the particle or defect size to the wavelength. Most photocathode materials absorb UV light strongly. A prior-art photocathode optimized for UV wavelengths usually needs to be thin because UV photons will be absorbed close to the illuminated surface. If the photocathode is not thin, the photoelectron may have a low probability of escaping from the output surface of the photocathode. Typically only photoelectrons that escape on the side of the photocathode facing the phosphor or image detector will generate an output signal. Such a thin photocathode optimized for UV wavelengths will typically have poor sensitivity at visible and infra-red wavelengths as a significant fraction of the incident photons at longer wavelengths will pass through the photocathode without absorption.

Another limitation of prior-art photocathodes is that the energy of the emitted photoelectron varies with the wavelength of absorbed light and may be several eV when a UV photon is absorbed. Because the direction in which the photoelectron is emitted is random, this electron energy results in a spread of the signal in a horizontal direction. Furthermore, the spread will vary with the wavelength of the absorbed photon, being greater for shorter wavelengths. In a thick photocathode, a photoelectron will usually undergo multiple collisions before being emitted and will be more likely to have an energy that is close to that determined by the temperature of the photocathode (i.e., the electron is more likely to be thermalized). However, when an electron undergoes multiple collisions within a photocathode, it is likely to recombine and be lost due to the high level of defects within and/or on the surface of prior-art photocathode materials. Hence, a reduced energy spread would come at the cost of substantially reduced sensitivity (most incident photons would no longer produce a signal).

Single-crystal (monocrystalline) silicon would appear to overcome many of the disadvantages just described. Silicon absorbs all wavelengths shorter than about 1.1 µm. Silicon crystals can be grown with very high purity and very few crystal defects. The recombination lifetime of electrons in high-quality single crystal silicon can be many microseconds, even hundreds of microseconds in the best quality material. Such long recombination lifetimes allow electrons generated many microns away from the surface to be able to migrate to a surface with a low probability of recombining.

However, in spite of its many advantages, the development of silicon-based photocathodes for commercial use has been prevented by two main disadvantages.

One disadvantage of silicon is that silicon has a relatively large work-function (approximately 4.8 eV, Allan and Gobelli, "Work Function, Photoelectric Threshold, and Surface States of Atomically Clean Silicon", Physical Review vol. 127 issue 1, 1962, pages 150-158) that works against the emission of photoelectrons generated by the absorption of photons. A material's work-function is the energy difference between an electron at the Fermi level and one at the vacuum level (i.e. that has escaped from the material). Silicon's relatively large band gap means that thermalized electrons cannot escape from silicon. Even UV photons absorbed close to the surface of silicon do not create much photocurrent because the photoelectrons do not have enough energy to escape. For example, a photon energy of 6.5 eV creates a photoelectron with an energy of about 3 eV (because direct absorption is more likely than indirect absorption at such a wavelength). A photoelectron with an energy of about 3 eV is not able to escape from the silicon because of the silicon work-function.

A second, more serious, problem with the use of silicon as a photocathode material is that silicon very readily forms a native oxide on its surface. Even in a vacuum, a native oxide will eventually form as the small amounts of oxygen and water present in the vacuum will react with the surface of the silicon. The interface between silicon and silicon dioxide has defects (due to dangling bonds) where the probability of an electron recombining is very high. Furthermore, the band gap of silicon dioxide is large (about 8 eV) creating an additional barrier higher than the work-function that an electron has to overcome in order to escape, even if the oxide is very thin (native oxide on a very smooth silicon surface is typically about 2 nm thick). The defect density at the silicon to oxide interface can be reduced by removing the native oxide and growing a thermal oxide at high temperature such as approximately 900-1000° C. Such a layer can be stable when grown to a thickness of about 1.5 nm to 2 nm. However, even a good quality thermal oxide has a significant defect density at its interface to silicon (typically $10^9$ to $10^{11}$ defects per $cm^2$), and the high band gap of the oxide combined with a minimum thickness of close to 2 nm still provides a significant barrier to electrons escaping even if the work-function can be overcome. A thin silicon nitride layer can be used to prevent growth of a native oxide layer on silicon, but the density of defects is higher at the silicon to silicon nitride interface than at the silicon to silicon dioxide interface, and the band gap for silicon nitride (about 5 eV) is large enough to prevent most electrons from escaping from the surface. For these reasons, silicon has never found significant commercial use as a photocathode.

What is therefore needed is a photocathode that overcomes some, or all, of the limitations of the prior art.

SUMMARY OF THE INVENTION

The present invention is directed to a photocathode structure including multiple field emitter protrusions that are integrally formed (patterned) on an output surface of a monocrystalline or polycrystalline silicon substrate, and a substantially pure boron (first) layer hermetically formed on at least tip (free end) portions of the field emitter protrusions. The introduction of integral field emitter protrusions onto the output surface circumvents the silicon substrate's relatively high work function by taking advantage of the field enhancement generated when the protrusions function as field emitters, which takes place when the substrate is subjected to an applied electric field that is high (strong) enough to reduce the potential barrier on the silicon-vacuum interface so that photoelectrons can tunnel through this barrier (quantum-mechanical tunneling) at the tip portions. The resulting emission current density can be estimated by a modified version of the Fowler-Nordheim theory, which takes into account the field enhancement factor due to the field emitters (R. Fowler and L. Nordheim, "Electron emission in intense electric fields", Proceedings of the Royal Society of London A, Vol. 119, No. 781, May 1928, pp. 173-181). Moreover, by forming the substantially pure boron layer such that it hermetically seals at least the tip portions of the field emitter protrusions, oxidation of the field emitter output surface is substantially entirely prevented, thereby avoiding the significant barrier to electron escape encountered in conventional approaches. Thus, by producing a photocathode including field emitter protrusions integrally formed on a single-crystal silicon substrate and hermetically protected by a substantially pure boron layer, the present invention provides a photocathode having the beneficial qualities of silicon (i.e., sub-1 µm wavelength absorption, high purity/low defect material, and long electron recombination times), while avoiding the negative aspects that have previously prevented the widespread commercial use of silicon-based photocathodes.

Various conventional semiconductor processing techniques are optionally utilized to optimize the performance of photocathodes produced in accordance with the present invention. For example, the silicon substrate is preferably essentially defect-free monocrystalline (single-crystal) silicon having a thickness in the range of about 10 nm to about 100 µm, where the thickness depends in part on the wavelength of light to be captured. In a preferred embodiment, the silicon substrate includes (e.g., implanted n-type) dopants having doping levels that are optimized such that, when the photocathode is subjected to an appropriate external electric field, each field emitter protrusion functions as a field emitter in a reverse bias mode. The field emitter protrusions are formed by etching or otherwise patterning the silicon substrate such that portions of the silicon material form integral structures having relatively wide base portions integrally connected to the output surface, and extend a height distance of at least 100 nm above the output surface to relatively narrow tip (free end) portions. In one embodiment, to facilitate optimal field emitter operations, the base portion of each field emitter protrusion has a minimum diameter/width dimensions of about 100 nm and a tip portion having maximum diameter/width dimension of about 200 nm, and more preferably approximately 100 nm or less. In the exemplary embodiments, the field emitter protrusions are fabricated using standard CMOS fabrication techniques (e.g., depositing a silicon dioxide or silicon nitride mask material by PECVD on a planar substrate surface, patterning the mask using known photolithographic techniques, and then etching the silicon substrate through openings in the mask to form the field emitter protrusions) such that the field emitter protrusions are arranged in a two-dimensional array pattern on the output surface of the silicon substrate. The boron layer is preferably formed using a high temperature deposition process (e.g., between about 600° C. and 800° C.) on clean, smooth silicon in a manner that produces a pin-hole free boron layer having a thickness in the range of 1-5 nm (preferably about 2 to 3 nm), whereby the boron layer circumvents silicon's oxidation problem by reliably hermetically sealing the entire output surface of the silicon substrate against oxidation. In alternative embodiments, the field emitter protrusions are formed using various protruding structure shapes, such as rounded whiskers (cylindrical posts with round tips), rounded cones or pyramids. The various techniques and features mentioned above may be used separately or in combination to enhance photocathode performance.

According to various alternative specific embodiments of the present invention, additional layers and structures are utilized to further enhance the beneficial qualities of the inventive photocathode structure. In some embodiments, one or several gate structures (control electrodes), are disposed on the output surface and placed at, or slightly lower than, the height of the field emitter tip portions in order to achieve fast and accurate control of the emission current. In some embodiments, a second boron layer (third layer) is formed on the illuminated (first) surface of the silicon substrate to further prevent oxides and defects that can reduce photon absorption. In another embodiment, an anti-reflective material layer (fourth layer) is disposed on second boron layer (third layer) to further enhance photon absorption. In some embodiments, a metal or conductive frame or grid and a voltage source are utilized to generate an external potential difference between the illuminated surface and the output surface of the silicon substrate in order to cause electrons to preferentially move towards the output surface. In some embodiments, the photocathode includes a combination of n-type silicon field emitter and p-i-n photodiode structure that operates in an avalanche multiplication condition when a high voltage (e.g., on the order of several tens or a few hundreds of volts) is applied between the illuminated surface and the output surface of the substrate. This avalanche gain enhances the effective quantum efficient and thus improves the performance of the photocathode. In yet other embodiments, boron (or another p-type dopant) is diffused into the silicon substrate through the illuminated surface to form a p-type doped region to create a potential gradient that drives electrons away from the illuminated surface where they might recombine and be lost.

In accordance with alternative specific embodiments, the inventive photocathode structures of the present invention are incorporated into various sensor structures to provide sensors exhibiting superior low light sensing capability. In addition to the photocathode (which is positioned adjacent to a receiving surface of the sensor), these sensor structures include a detection device (e.g., a CCD or CMOS image sensor) having a detecting surface that faces the output surface of the photodiode and is spaced from the boron layer on the output surface of the substrate by an intervening gap, where the detection device serves to detect photoelectrons emitted through the output surface of the photocathode, and to generate electric signals indicating the capture of photoelectrons. In some sensor embodiments, the sensor structure is an electron-bombarded charge-coupled device (EBCCD) that may (or may not) have a window on top of the photocathode. In other embodiments of the invention, the sensor is an image intensifier that may (or may not) have a window on top of the photocathode. In yet other embodiments of the invention, the sensor is a photomultiplier that may (or may not) have a window on top of the photocathode.

In some sensor embodiments, a second boron layer is formed on the illuminated surface of the photocathode to prevent oxide formation on the illuminated surface, and an anti-reflective material layer is provided over the second boron layer to improve photon capture efficiency. In some of these embodiments, the anti-reflective material layer is disposed between a window and the photocathode, but in other embodiments the anti-reflective material layer also serves as the sensor's receiving surface (i.e., the sensor does not have a window over the illuminated surface of the photocathode), which further increases photon capture efficiency by the sensor. In other sensor embodiments that include a window over the illuminated surface of the photocathode, an anti-reflective material layer is provided on the window to improve photon capture efficiency.

In some embodiments of the invention, a sensor including the photocathode of the present invention also includes a silicon-based detection device having an additional boron layer on its receiving surface (i.e., the surface of the detection device facing the photocathode). For example, in cases where the sensor is an electron-bombarded CCD (EBCCD) and the detection device is a CCD (which are typically formed on silicon substrates), a boron layer is formed directly on the CCD's receiving surface during fabrication to improve electron capturing efficiency of the sensor by preventing the formation of a silicon dioxide layer on the CCD's receiving surface. In other embodiments, the sensor includes a CMOS detector (i.e., instead of a CCD), and the additional boron layer is formed on the receiving surface of the CMOS detector.

In other embodiments of the invention, sensors including the inventive photocathode are utilized in wafer, reticle or photomask inspection systems. In particular, the inventive systems include an illumination source (e.g., a laser system) for transmitting light onto a sample/wafer, one or more sensors (e.g., a photomultiplier, an image intensifier or an EBCCD) that utilize any of the inventive photocathodes described herein to detect photons passing through or reflected by the sample/wafer, and an associated optical system for guiding the light/photons from the illumination source to the sample (wafer, reticle or photomask), and from the sample to the sensor.

BRIEF DESCRIPTION OF THE DRAWINGS

The present invention is illustrated by way of example, and not by way of limitation, in the figures of the accompanying drawings in which:

FIGS. 8(A), 8(B), 8(C) and 8(D) are simplified diagrams showing inspection systems according to additional embodiments of the present invention;

DETAILED DESCRIPTION

The present invention relates to an improvement in low light sensors for semiconductor inspection systems. The following description is presented to enable one of ordinary skill in the art to make and use the invention as provided in the context of a particular application and its requirements. As used herein, directional terms such as "top", "bottom", "over", "under", "upper", "upward", "lower", "down" and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
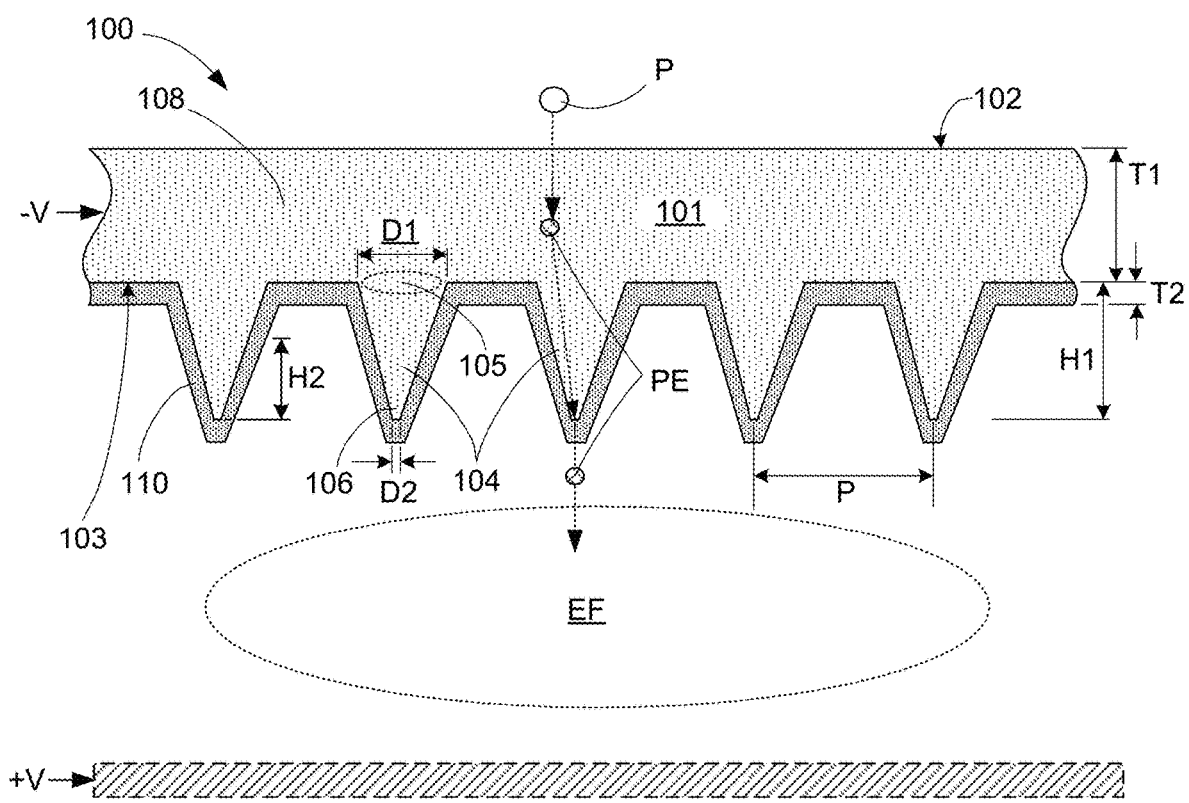
FIG. 1 is a cross-sectional side view illustrating a photocathode including a field emitter array formed on a silicon substrate according to a simplified generalized embodiment of the present invention.

FIG. 1 illustrates, in cross section view, a photocathode 100 according to a generalized embodiment of the present invention. Photocathode 100 generally includes a silicon substrate 101 having an upward-facing illuminated (top/first) surface 102 and an opposing downward-facing output (bottom/second) surface 103, an array of field emitter protrusions 104 integrally formed on (i.e., patterned into and formed by portions of the silicon material) and extending from output surface 103, and a substantially pure boron layer 110 hermetically disposed on output surface 103 over field emitter protrusions 104. With this arrangement, photocathode 100 operates similarly to conventional photocathodes in that, when properly positioned subjected to an appropriate electric field EF, photons P entering silicon substrate 101 through illuminated (upper) surface 102 are absorbed and create photoelectrons PE that are then emitted through output surface 103. According to an aspect of the present invention, output surface 103 is operably configured such that, when electric field EF is present, field emitter protrusions 104 function as a field emitter array (FEA) that greatly increases the probability that a given photoelectron PE generated in substrate 101 will be emitted from output surface 103. According to another aspect, boron layer 110 serves to protect field emitter protrusions 104 from oxidation that facilitates reliable long term operation of photocathode 100. Moreover, the present inventors have determined that boron is substantially transparent to low energy electrons, making boron an ideal hermetic seal material for silicon-based photocathodes.

According to a practical embodiment, silicon substrate 101 is preferably implemented using monocrystalline silicon (i.e., a single crystal of silicon) that is p-type doped (i.e., contains a p-type dopant 108) at a doping level less than about $10^{19}$ cm$^3$, i.e. a resistivity of about 0.005 Ωcm or higher. Since minority carrier lifetime and diffusion length decrease with increasing dopant concentration, dopant concentrations higher than about $10^{19}$ cm$^{-3}$ may be used when the silicon is very thin, such as thinner than about 1 μm, whereas when the silicon is thicker than about 1 μm, dopant concentrations lower than about $10^{19}$ cm$^{-3}$ may be preferred. In other embodiments, silicon substrate 101 comprises polycrystalline silicon or multi-crystalline silicon. Depending on the intended wavelength operating range of the photocathode, the silicon may be between about 10 nm and about 100 μm in thickness. Silicon substrate 101 exhibits a band gap of approximately 1.1 eV, so light with a vacuum wavelength shorter than approximately 1.1 μm is absorbed. The 1.1 eV band gap of silicon substrate 101 is indirect, so absorption of wavelengths in the red and infra-red part of the spectrum is weak. Silicon substrate 101 also has a direct band gap of approximately 3.5 eV, so it strongly absorbs deep UV wavelengths. Depending on the intended use for photocathode 100, silicon substrate 101 has a thickness T1 in the range of approximately 20 nm to approximately 100 μm. For example, in order to facilitate a high probability of absorbing a photon in the infra-red part of the spectrum, silicon substrate 101 is formed with a thickness T1 of about 10 μm or several tens of μm. Alternatively, for absorbing UV wavelengths, silicon substrate 101 is formed with a thickness T1 in a range of a few tens of nm to about 100 nm. In a practical embodiment, silicon substrate 101 has a thickness T1 of about 1 μm in order to absorb at least 85% of the unreflected incident photons over a wavelength range from the vacuum UV to approximately 670 nm near the red end of the visible spectrum. When silicon substrate 101 comprises a monocrystalline (single crystal) structure that is grown with very low density of crystal defects and high purity using known techniques, a photoelectron generated inside silicon substrate 101 has a potential lifetime of tens or hundreds of microseconds (μs). In addition, the single crystal structure causes photoelectrons to lose much of their excess energy and partially, or substantially, thermalize with a low probability of recombining.

In accordance with preferred practical embodiments, field emitter protrusions 104 are fabricated on silicon substrate 101 using standard CMOS fabrication techniques. Each field emitter protrusion 104 has a relatively wide base portion 105 integrally connected to output surface 103, and extends a height distance H1 of at least 100 nm above output surface 103 to a relatively narrow tip (free end) portion 106. In one embodiment, to facilitate optimal field emitter operations, base portion 105 of each field emitter protrusion 104 has a minimum diameter/width dimensions D1 of about 100 nm, and tip portion 106 has a maximum diameter/width dimension D2 of 200 nm, and more preferably approximately 100 nm or less. During fabrication, silicon dioxide or silicon nitride can be used as a mask material and deposited by, for example, PECVD, and photolithography can be used for patterning. Both dry etching (such as RIE, ICP and ECR) and wet etching can be used to form the array of field emitter protrusions arranged in a two-dimensional periodic pattern (e.g., as depicted in FIG. 2(B), discussed below). An important parameter influencing the field emitter properties is the spacing (pitch) P between emitter protrusions 104. It is known that closely-spaced emitters reduce the field enhancement factor due to screening effects resulting in insufficient electric field penetration between the individual emitters. Hence, to minimize field-shielding effects and to optimize field emission current density, the distance between vertically aligned emitters should be between approximately twice and approximately 20 times their height (see for instance, R. Serbun, B. Bornmann, A. Navitski, C. Prommesberger, C. Langer, F. Dams, G. Müller, and R. Scheiner, "Stable field emission of single B-doped Si tips and linear current scaling of uniform tip arrays for integrated vacuum microelectronic devices", Journal of Vacuum Science and Technology B, Vol. 31, No. 2, 2013, pp. 02B101). For example, when field emitter protrusions have a nominal height H1 equal to 500 nm, spacing P should be between approximately 1 μm and approximately 10 μm.

According to another aspect of the present invention, the field emitters are configured to operate in reverse bias mode as in a p-n diode, in which a depletion layer is generated due to the high electric field at the emitter surface. In this embodiment, regions near the tips of the field emitter protrusions 104 may be doped with an n-type dopant (such as phosphorous or arsenic) either before or after formation of the protrusions. Field emission takes place when the applied electric field is high enough to reduce the potential barrier on the silicon-vacuum interface so that the electron can tunnel through this barrier (quantum-mechanical tunneling). In a semiconductor, where the electron concentration is determined by the local doping level and potential, it is possible to set the field emitters in reverse bias mode. The emission current density can be estimated by a modified version of the Fowler-Nordheim theory, which takes into account the field enhancement factor due to the field emitters.

According to another aspect of the present invention, boron layer 110 comprises substantially pure boron that is disposed directly on output surface 103 such that at least tip portions 106 of field emitter protrusions 104 are hermetically sealed. As used herein, the phrase "substantially pure boron" means boron having a purity of 95% or higher, and the phrase "directly on" in conjunction with the boron-to-silicon interface is intended to mean that there are no continuous intervening layers (e.g., oxide or $SiN_x$ layers) separating output surface of field emitter protrusions 104 and boron layer 110 other than a possible thin layer (i.e., a few monolayers) of $SiB_x$ that may form at the Si/B interface. Note also that the phrase "directly on" does not preclude the presence of discontinuous oxide molecules or patches between some portions of the boron and silicon that may inadvertently form before or during the formation of boron layer 110. In one embodiment, substantially pure boron layer 110 is grown on clean smooth silicon at a high temperature (i.e., at a temperature higher than approximately 500° C., preferably between about 600° C. and 800° C.) using techniques taught by F. Sarubbi et al. "Chemical Vapor Deposition of a-Boron Layers on Silicon for Controlled Nanometer-Deep p+n Junction Formation", Journal of Electronic Materials, Vol. 39, No. 2, (February 2010) pp. 162-173, ISSN 0361-5235 such that the boron forms a pin-hole free coating having a thickness T2 in the range of approximately 1 nm to 5 nm, preferably approximately 2 to 3 nm. As Sarubbi et al. explain on p 163 of the cited reference, it is important to remove all native oxide from the silicon by, for example, a wet clean followed by an in-situ thermal hydrogen clean prior to depositing the boron. Lower temperature deposition of boron is also possible, though the coating may be less uniform, and a coating thicker than 2 nm may be needed to ensure that it is pin-hole free. An advantage of forming substantially pure boron layer 110 in this manner is that the resulting pin-hole free boron coating, when applied to a clean silicon surface, serves as a hermetic seal that prevents formation of native oxide on the underlying silicon surface. As used herein, the phrase "hermetically disposed" means that boron layer 110 is formed in the manner set forth above, and the phrase "at least on the tip portion" means that the hermetically disposed boron coating extends at least distance H2 from tip portions 106 along each field emitter protrusion 104, where distance H2 is at least 10% of total protrusion height H1. In a preferred embodiment, boron layer 110 is hermetically disposed over an entirety of output surface 103. As previously described, a silicon dioxide layer has a high band gap and even thin layers can block a significant fraction of electrons from leaving the silicon. Boron layer 110 thus allows even electrons with low energies to leave tip portions 106 during operation. Prior art devices could not avoid the use of low work-function alkali metal or alkali metal oxide material like cesium or cesium oxide. Although it is known in the art that an alkali metal layer can lower the work function of a photocathode output surface by creating a negative electron affinity device at the output surface, after a certain usage time this layer becomes thinner as the alkali metal leaves the output surface. By hermetically disposing substantially pure boron layer 110 on output surface 103, the resulting field emitter array of photocathode 100 circumvents this limitation and the sharp-tipped field emitter protrusions 104 provide field enhancement and more emission current. In addition, prior art devices could not avoid a silicon dioxide interface layer from forming between the silicon and the low work-function material, even if the silicon layer was free of oxide when coated. That is, without an impervious pin-hole-free protection layer on the silicon, oxygen would eventually migrate to the silicon surface and form an oxide layer. An advantage of providing hermetically disposed, substantially pure boron layer 110 on output surface 103 is that even a very thin (e.g., 1 nm) pin-hole-free boron layer is impervious to oxygen and protects the silicon against oxidation. Another advantage of providing hermetically disposed, substantially pure boron layer 110 on output surface 103 with a thickness in the range of 1 nm to 5 nm is that the density of defects and interface traps at the silicon-to-boron interface is typically lower than at the silicon-to-silicon-dioxide interface so substantially pure boron layer 110 also serves to reduce the fraction of electrons lost to recombination at the surface before they can be emitted.

According to alternative specific embodiments, field emitter protrusions 104 are implemented using various geometrical forms such as rounded whiskers, rounded cones or pyramids that are arranged in a two-dimensional periodic pattern on output surface 103.

Figure 2A:
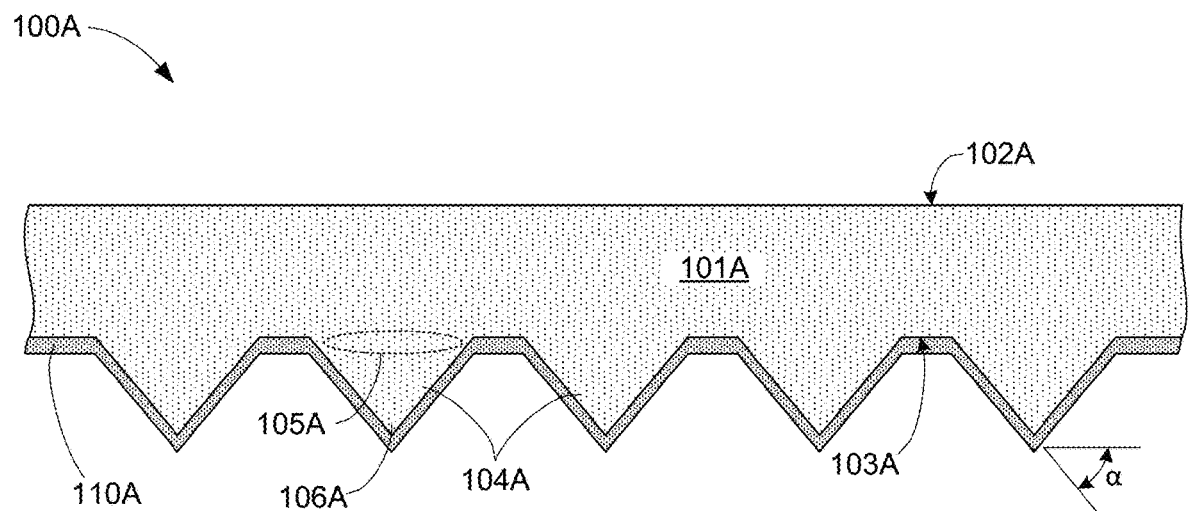
FIGS. 2(A) and 2(B) are enlarged partial cross-sectional side and partial perspective views showing a silicon photocathode according to a first specific embodiment of the present invention.
Figure 2B:
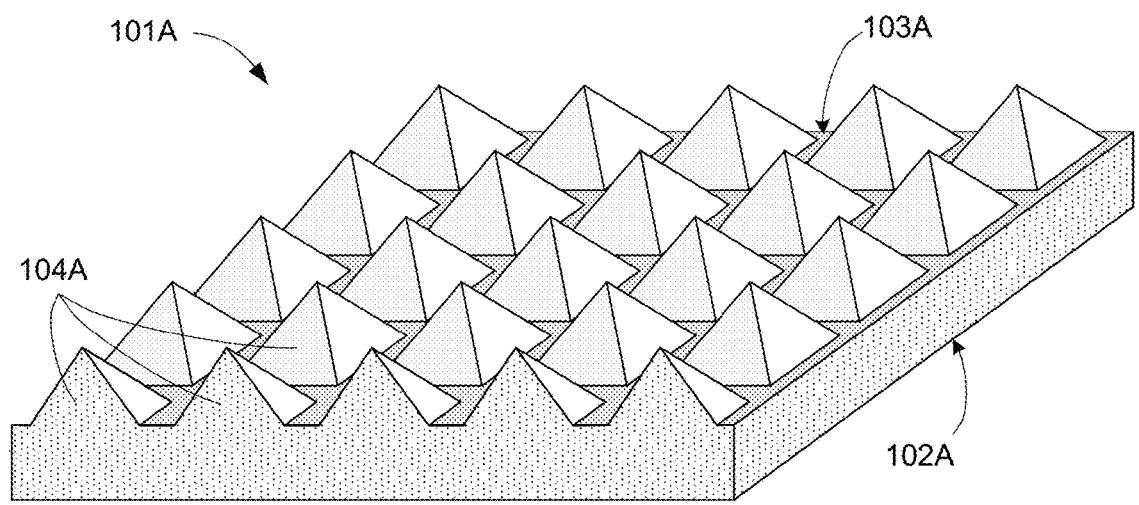

FIGS. 2A and 2B depict a photocathode 100A including a substrate 101A having a planar input (upper) surface 102A, an array of pyramid-shaped field emitter protrusions 104A integrally formed on an opposing output surface 103A, and a substantially pure boron layer 110A hermetically disposed on output surface 103A in the manner described above. Each field emitter protrusion 104A comprises a pyramid-shaped structure including four angled walls extending from a relatively wide fixed (base) portion 105A to a relatively narrow tip (free end) portion 106A. In one embodiment, the pyramidal shape of field emitter protrusions 104A is achieved by anisotropic etching silicon substrate 101, preferably such that the etching process produces field emitter protrusions 104A with slope angles α close to 54.7° (i.e., because that slope angle corresponds to the intersection of the (100) and (111) planes in monocrystalline silicon). Although adjacent pyramid-shaped field emitter protrusions 104A are depicted as being separated by narrow sections of relatively planar output (lower) surface 103, in other embodiments these narrow planar sections may be eliminated by further etching the silicon until the peripheral edges of adjacent pyramid-shaped structure abut each other (i.e., output surface 103A substantially entirely comprises field emitter protrusions 104A). Although FIG. 2B depicts the array of field emitter protrusions as being positioned on a square grid, the protrusions may lie on a different grid pattern, such as on a hexagonal grid.

Figure 3:
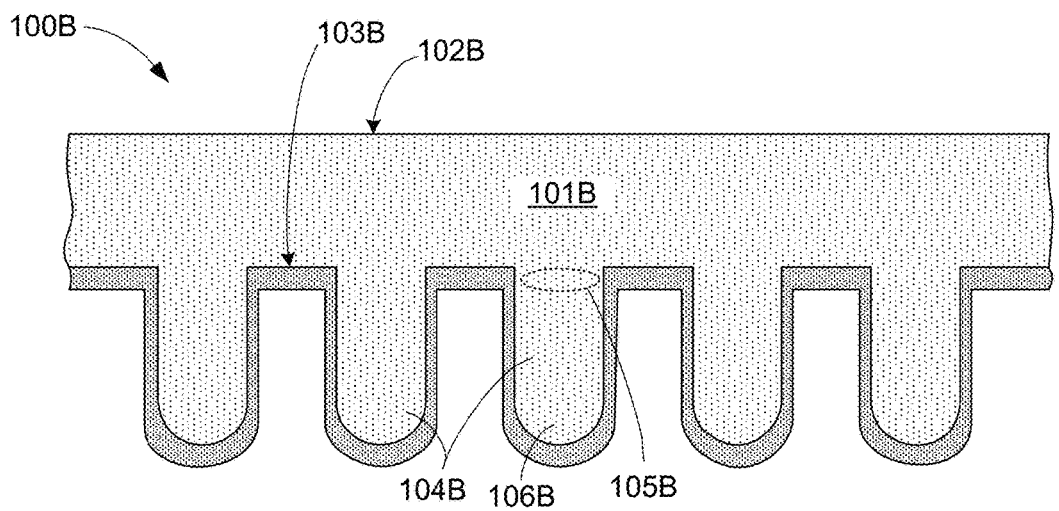
FIG. 3 is an enlarged partial cross-sectional side view illustrating a photocathode in accordance with another exemplary specific embodiment of the present invention.

FIG. 3 depicts a photocathode 100B including a substrate 101B having a planar input (upper) surface 102B, an array of spaced-apart field emitter protrusions 104B integrally formed on opposing output surface 103B, and a substantially pure boron layer 110B hermetically disposed on output surface 103B. In this embodiment, field emitter protrusions 104B are formed as rounded whiskers having approximately circular base portions 105B and substantially cylindrical central portions that extend away from output surface 103B to rounded tip portions 106B. In an alternative embodiment, the substantially cylindrical central portions of protrusions 104B may be angled to form rounded cone-shaped structures, preferably with a zero-degree, or near zero-degree, half angle. It is known that rounded whiskers, or rounded cones with a near zero-degree half angle, provide a higher field enhancement in comparison with rounded cones or pyramids with a half angle greater than zero degrees (see for instance, T. Utsumi, "Vacuum microelectronics: What's new and exciting", IEEE Transactions on Electron Devices, Vol. 38, No. 10, 1991, pp. 2276-2283). Dry etching techniques known to those skilled in the art, such as RIE, ECR, and ICP, can be utilized to fabricate the rounded whisker field emitter protrusions 104B.

FIGS. 4(A) to 4(F) illustrate inventive photocathodes according to various alternative embodiments of the present invention in which additional layers and structures are utilized to further enhance the beneficial qualities of the inventive photocathode structures described above. The illustrated exemplary embodiments are not intended to be exhaustive, and photocathodes including combinations of the additional layers and structures described below are understood to be possible.

Figure 4A:
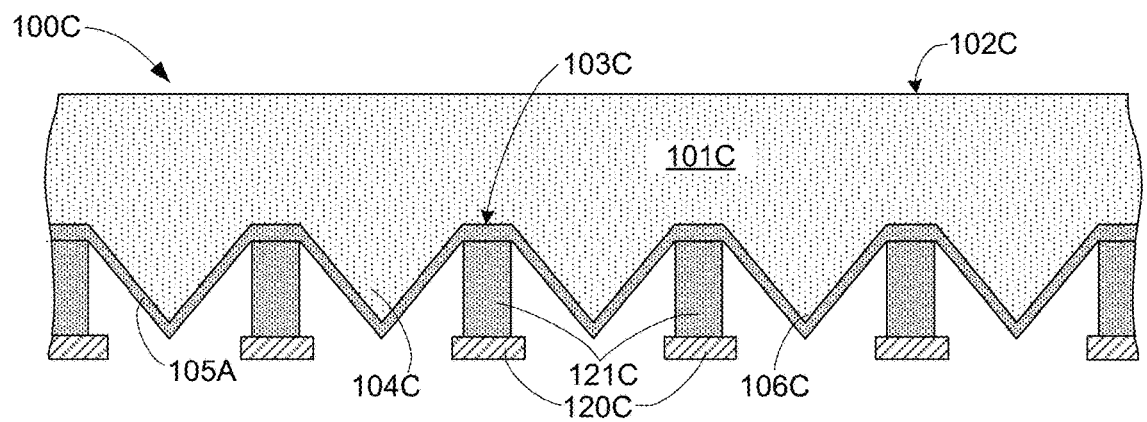
FIGS. 4(A), 4(B), 4(C), 4(D), 4(E) and 4(F) are cross-sectional views showing photocathodes in accordance with additional exemplary specific embodiments of the present invention.

FIG. 4(A) illustrates, in cross section view, a photocathode 100C including a silicon substrate 101C having a planar input surface 102C, an array of field emitter protrusions 104C disposed on an opposing output surface 103C, and a boron layer 110C disposed on output surface 103C over field emitter protrusions 104C. Photocathode 100C differs from the previously described embodiments in that a continuous gate or control electrode 120C is placed approximately level with tip portions 106C of field emitter protrusions 104C and attached to output surface 103 by way of dielectric structures 121C. Gates 120C are operated using control voltages between about 10V and 100V relative to the substrate to achieve fast and accurate control over the emission current from field emitter protrusions 104C during operation. A positive extractor voltage relative to the substrate 101C may be applied to gates 120C to enhance emission, and negative voltages relative to the substrate may be applied to suppress emission, if required. Gates 120C and dielectric structures 121C gate layer can be fabricated by standard CMOS fabrication techniques. In the depicted embodiment, gates 120C are formed in a triode configuration (i.e., all gates 120C are disposed in only one gate layer). In other embodiments (not shown), two or more gate layers may be utilized.

Figure 4B:
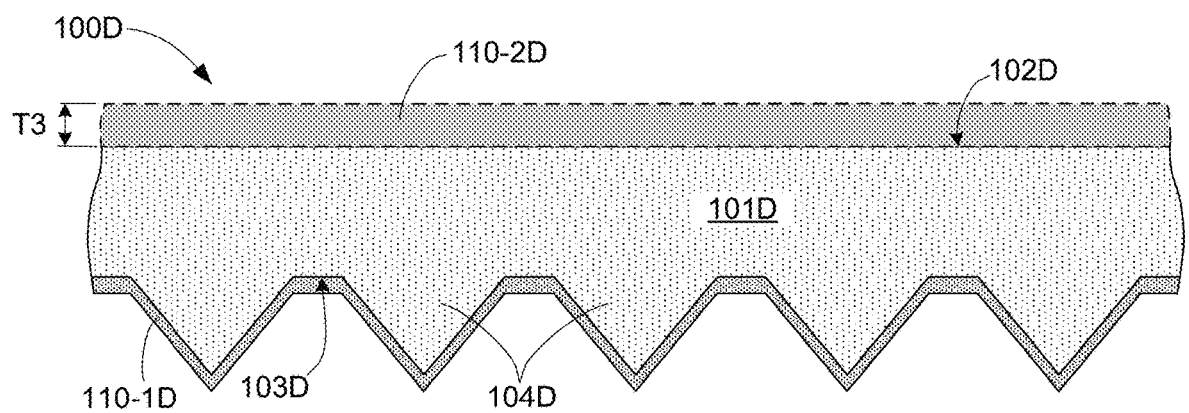

FIG. 4(B) depicts a photocathode 100D including a silicon substrate 101D having a planar input surface 102D, an array of field emitter protrusions 104D disposed on an opposing output surface 103D, and a (first) boron layer 110-1D disposed on output surface 103D over field emitter protrusions 104D in the manner described above. In addition, photocathode 100D includes a second boron layer 110-2D that is formed on upward-facing input (illuminated) surface 102D of silicon substrate 101D. Both boron layers 110-1D and 110-2D are formed on substrate 101D using the techniques described above with reference to the formation of boron layer 110 (see FIG. 1). Although boron does absorb at UV wavelengths, by forming second boron layer 110-2D with a thickness T3 of approximately 5 nm or less, only a small fraction of the incident photons are absorbed. Furthermore, since boron is a p-type dopant in silicon, the presence of second boron layer 110-2D will tend to drive photoelectrons away from illuminated surface 102D, which serves to improve the efficiency of photocathode 100D by reducing the likelihood of electrons recombining at illuminated surface 102D. A similar result can be achieved by implanting a p-type dopant in a very shallow layer at surface 102D. Accordingly, in an alternative embodiment (not shown), illuminated surface 102D is free from residual boron, and boron (or another p-type dopant) is implanted or diffused into silicon substrate 101D below illuminated surface 102D. That is, although boron layer 110-2D may serve to prevent the formation of oxides on illuminated surface 102D, the presence of an oxide coating on illuminated surface 102D need not significantly degrade the quantum efficiency of photocathode 100D and, with the appropriate choice of oxide thickness, can usefully reduce the reflectivity of illuminated surface 102D at a wavelength of interest.

Figure 4C:
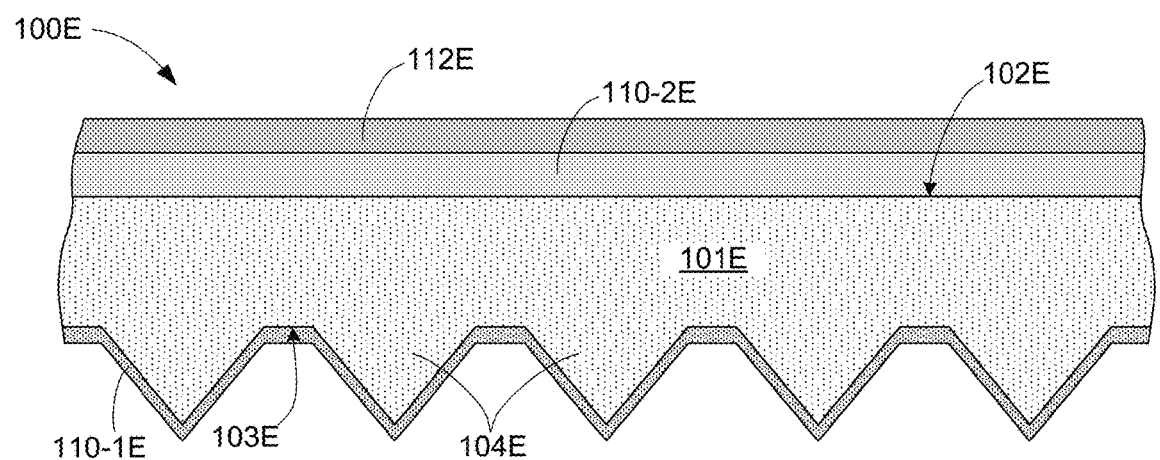

FIG. 4(C) depicts a photocathode 100E including a silicon substrate 101E having a planar input (illuminated) surface 102E, an array of field emitter protrusions 104E disposed on an opposing output surface 103E, a lower (first) boron layer 110-1E disposed on output surface 103E over field emitter protrusions 104E, and an upper (second) boron layer 110-2E disposed on illuminated surface 102E, all formed in the manner described above. Photocathode 100E differs from the previously discussed embodiments in that it further includes one or more anti-reflection coating layers 112E disposed on upper boron layer 110-2E. In exemplary specific embodiments, anti-reflection coating layer 112E is formed using materials that are useful for UV and deep UV anti-reflection layer, including (but not limited to) silicon dioxide, silicon nitride, magnesium fluoride, and hafnium dioxide. For photocathodes that need high quantum efficiency at UV wavelengths, the density of defects and trapped charges at and near the illuminated surface must be kept low because UV photons are absorbed near the illuminated surface. As mentioned above, any dielectric material coated directly on the illuminated surface of a silicon substrate will create defects and trapped charges at the surface and within the bulk of the dielectric, and will degrade the quantum efficiency of the photocathode particularly for deep UV wavelengths that are absorbed close to the surface. By first forming upper boron layer 110-2E as a thin pin-hole-free layer (e.g., approximately 2 nm to 5 nm), illuminated surface 102E remains essentially free of defects and trapped charges, and photocathode 100D includes enhanced high quantum efficiency that is provided by anti-reflection coating layer 112E. Upper boron layer 110-2E can also, at least partially, shield silicon substrate 101E from trapped charges in any additional layers disposed over anti-reflection coating layer 112E.

Figure 4D:
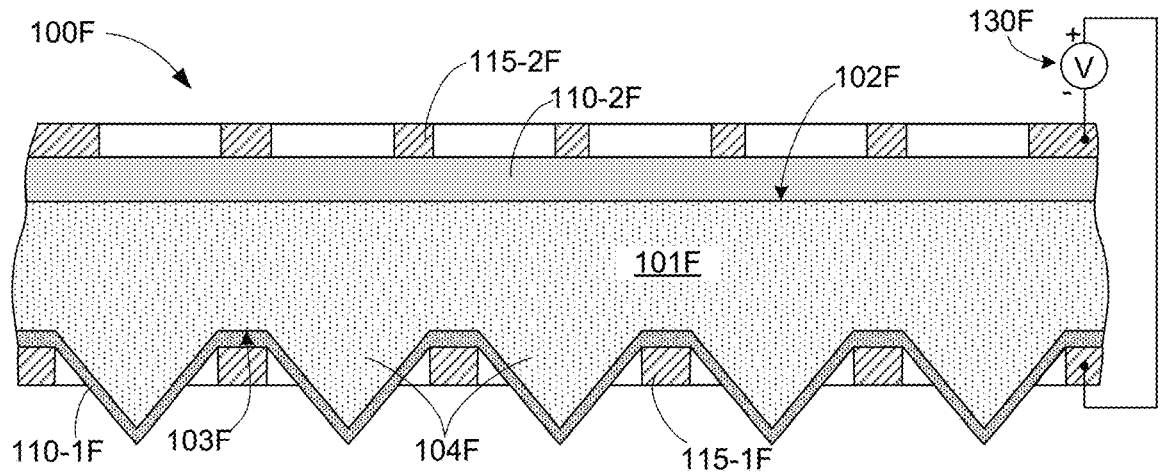

FIG. 4(D) depicts a photocathode 100F including a silicon substrate 101F having a planar input (illuminated) surface 102F, an array of field emitter protrusions 104F disposed on an opposing output surface 103F, a lower (first) boron layer 110-1F disposed on output surface 103F over field emitter protrusions 104F, and an upper (second) boron layer 110-2F disposed on illuminated surface 102F, all formed in the manner described above. Photocathode 100F differs from the previous embodiments in that photocathode 100F includes conductive structures 115-1F and 115-2F respectively disposed on opposite sides of substrate 101F that, when connected to an appropriate external voltage source 130F, facilitate the application of an external potential difference across silicon substrate 101F in order to cause photoelectrons generated in silicon substrate 101F to preferentially move towards output surface 103F during operation of photocathode 100F. In alternative specific embodiments, conductive structures 115-1F and 115-2F comprise metal borders disposed around the peripheral edges of substrate 101F, or sparsely disposed metal grids respectively disposed on lower boron layer 110-1F and upper boron layer 110-2F to ensure a good electrical connection to the opposing surfaces of substrate 101F. Because the highly doped silicon forming substrate 101F is a weak conductor, generating a suitable potential difference (e.g., less than approximately 5 V) between illuminated surface 102F and output surface 103F serves to generate a higher flow of photoelectrons through output surface 103F.

Figure 4E:
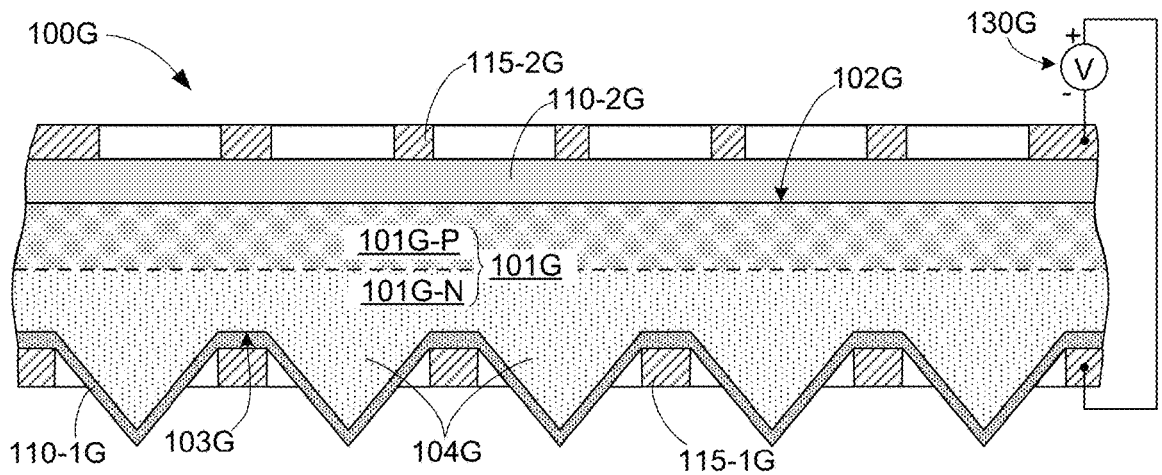

FIG. 4(E) depicts a photocathode 100G including a silicon substrate 101G having a planar input (illuminated) surface 102G, an array of field emitter protrusions 104G disposed on an opposing output surface 103G, a lower (first) boron layer 110-1G disposed on output surface 103G over field emitter protrusions 104G, and an upper (second) boron layer 110-2G disposed on illuminated surface 102G, all formed in the manner described above. Photocathode 100G differs from the previous embodiments in that silicon substrate 101G is processed using known techniques to include a p-doped region 101G-P and an n-doped region 101G-N configured such that illuminated surface 102G is entirely disposed on p-doped region 101G-P and output surface 103G (including field emitter protrusions 104G) are entirely disposed on n-doped region 101G-N. Note that p-doped region 101G-P abuts n-doped region 101G-N inside substrate 101G to form a p-i-n photodiode structure, and that n-doped region 101G-N causes field emitter protrusions 104G to implement an n-type silicon field emitter during operation of photodiode 100G. In addition, conductive structures 115-1G and 115-2G similar to those described above with reference to FIG. 4(D) are utilized to ensure good electrical connection of an external voltage source 130G across the opposing surfaces of substrate 101G. With this arrangement, the n-type silicon field emitter and p-i-n photodiode structure operate in an avalanche multiplication condition when source 130G applies a high voltage potential (e.g., on the order of a few tens of to several hundred volts) between illuminated surface 102G and output surface 103G. This avalanche gain enhances the effective quantum efficiency and thus improves the performance of photocathode 100G.

Figure 4F:
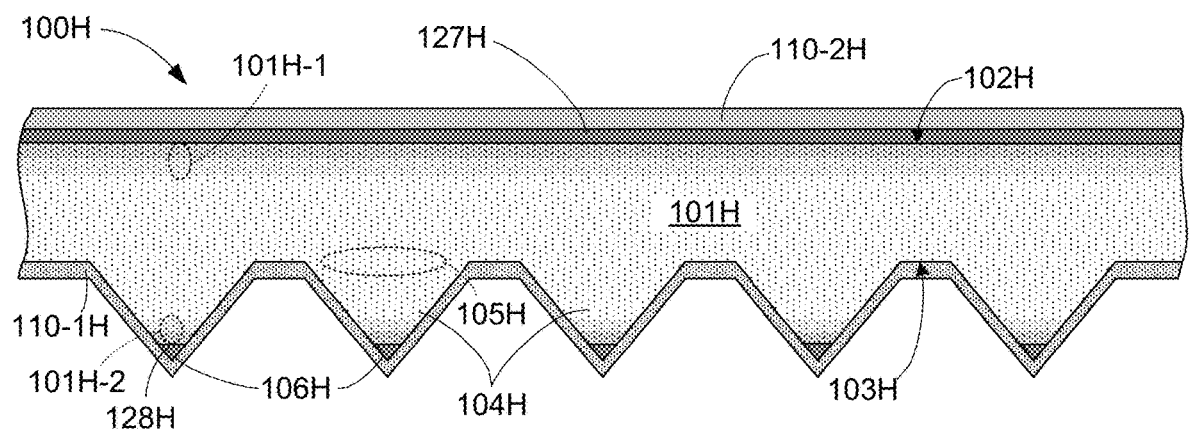

FIG. 4(F) depicts a photocathode 100H including a silicon substrate 101H having a planar input (illuminated) surface 102H, an array of field emitter protrusions 104H disposed on an opposing output surface 103H, a lower (first) boron layer 110-1H disposed on output surface 103H over field emitter protrusions 104H, and an upper (second) boron layer 110-2H disposed over illuminated surface 102H, all formed in the manner described above. Photocathode 100H differs from previous embodiments in that p-type and n-type dopants are diffused into substrate 101H from one or both of illuminated surface 102H and output surface 103H in a manner that generates gradient doping sections 101H-1 and 101H-2 having relatively high doping concentrations adjacent the silicon surface and relatively light doping concentrations away from the surface. Gradient doping sections 101H-1 and 101H-2 are configured to direct (bias) photoelectrons generated within silicon substrate 101H towards tips 106H of protrusions 104H. In the illustrated embodiment, gradient doping section 101H-1 is generated by forming a thin boron silicide layer 127H between illuminated surface 102H and upper boron layer 110-2H. This arrangement causes some of the boron from boron silicide layer 127H to diffuse into silicon substrate 101H through illuminated surface 102H to form p-type gradient diffusion region 101H-1 having a higher p-type dopant concentration in portions near illuminated surface 102H than in portions disposed further from illuminated surface 102H in substrate 101H (as indicated by shaded area), thereby creating a potential gradient that will tend to drive electrons away from illuminated surface 102H into substrate 101H. In embodiments of the invention that omit a boron layer on the illuminated surface, a p-type dopant, such as boron, is implanted or diffused into the silicon from the illuminated surface in order to create gradient diffusion region 101H-1. Similarly, a very thin (one, or a few, monolayers) boron silicide layer 128H is formed between tip portions 106H of field emitter protrusions 104H and lower boron layer 110H-1, whereby some of the boron diffuses a short distance into the silicon to form gradient diffusion region 101H-2 (indicated by shading). In some embodiments, gradient diffusion region 101H-2 may comprise other p-type or n-type dopants implanted into the silicon in order to modify the electric field gradients near tip portions 106H of protrusions 104H.

Figure 5:
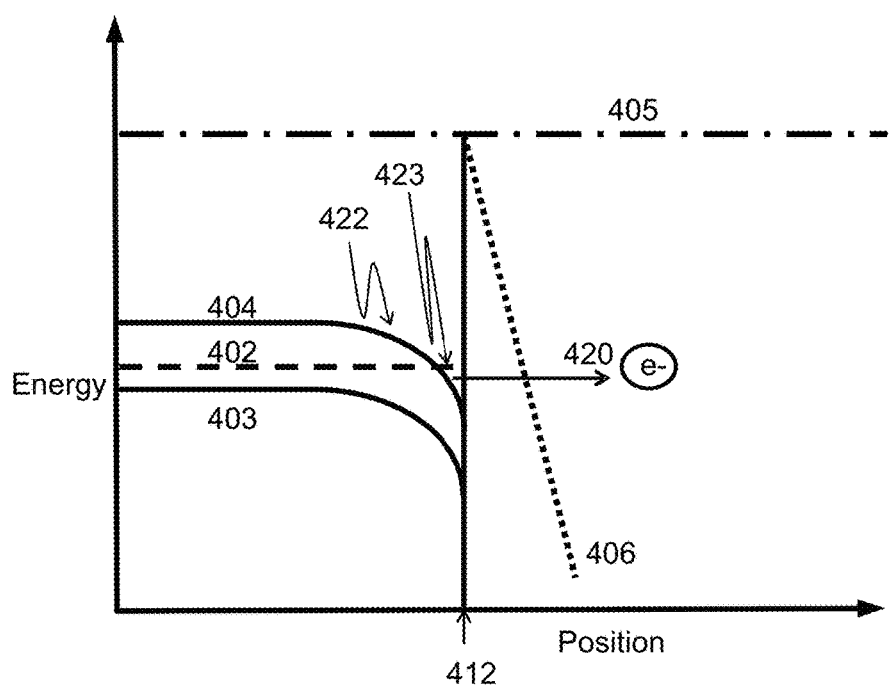
FIG. 5 is an energy diagram illustrating exemplary electron energy levels inside the silicon substrate of a photocathode formed in accordance with the present invention.

FIG. 5 is an exemplary energy diagram illustrating electron field emission of an exemplary inventive photocathode formed in accordance with the embodiments described above. The vertical direction represents energy. Note that this figure is not to scale, is distorted and some aspects are exaggerated in order to more clearly illustrate key aspects of the photocathode. Dashed line 402 represents the Fermi level within the photocathode. Line 403 represents the top of the valence band within the semiconductor. Line 404 represents the bottom of the conduction band. The difference between the bottom of the conduction band and the top of the valence band is called the band gap. For silicon the band gap is approximately 1.1 eV, but reduces where the dopant concentration is high. Dot-dashed line 405 represents the vacuum energy level. The small-dashed line 406 in the vacuum region represents the potential distribution for the field emitter with the anode (not shown) located at a large distance, such as a distance larger than several microns. The position of the tip of a field emitter protrusion is indicated by label 412.

The illuminated surface (not shown) of the photocathode is heavily p-doped, either from explicit doping or from diffusion of boron from a surface boron coating (not shown because, if present, it is only a few nm thick), or from a combination of the two. Because of the heavy p-type doping near the surface, the Fermi level is just above the top of the valence band. For example, for high levels of boron doping, the gap between the Fermi level and the top of the valence band might be as small as approximately 0.05 eV. As the dopant concentration decreases away from the surface, the gap between the Fermi level and the top of the valence band increases causing the conduction and valence bands to bend down away from the surface as indicated by arrow 420.

When a free electron is created by absorption of a photon, that electron will be in the conduction band. The electron is initially created with an energy that is approximately equal to the difference between the photon energy and the band gap. In silicon, the excess energy is usually quickly lost, so that the electron quickly reaches an energy close to the bottom of the conduction band. Because the downward slope in the conduction band is close to the illuminated surface, any electrons created near that surface will quickly move away from that surface and are unlikely to recombine at any defects that exist on or near the illuminated silicon surface. Since deep UV photons are very likely to be absorbed within a few nm of the illuminated silicon surface, high quantum efficiency of the photocathode at deep UV wavelengths is made possible by this dopant profile near the surface.

The field emission from silicon field emitters can be described by the well-known Fowler-Nordheim tunneling. The local field at the emitter tips is enhanced by a field enhancement factor compared with the applied electric field. As the external electric field penetrates into the semiconductor, the carrier concentration in the near-surface region changes, and both the conduction band 404 and valence band 403 bend at the emitter surface as indicated by label 422.

If the conduction band is bent by an energy sufficient to bring the bottom of the conduction band 404 below the Fermi level 402, electrons collect in the dip as depicted at 423. The highest filled level of the collection coincides with the Fermi level 402, which remains constant throughout the bulk of the semiconductor. The external field accelerates electrons as they move toward the photocathode surface 412 and allows them to reach surface 412 with enough energy to have a high probability of escaping.

For a high electrostatic bias field such as $10^7$ V/cm, the conduction band of p-type field emitter will be degenerate at the surface, and a depletion region, in which the Fermi level 402 lies in the middle of the energy gap, is created between the p-type interior and the n-type surface. This leads to a minimum concentration of electrons and holes in such region, similar to the case of a reverse-biased p-n junction.

In prior art photocathodes based on silicon, there would be a thin oxide layer on the silicon surface. This oxide, even though only about 2 nm thick, represents a substantial barrier to any electrons trying to escape. The band gap of silicon dioxide is approximately 8 eV. Such a large band gap results in a local peak in the conduction band that is several eV higher than the conduction band within the silicon. The boron layer on the photocathode surface blocks oxygen or water from reaching the silicon surface and prevents growth of an oxide layer, thus enabling an efficient photocathode.

Figure 6A:
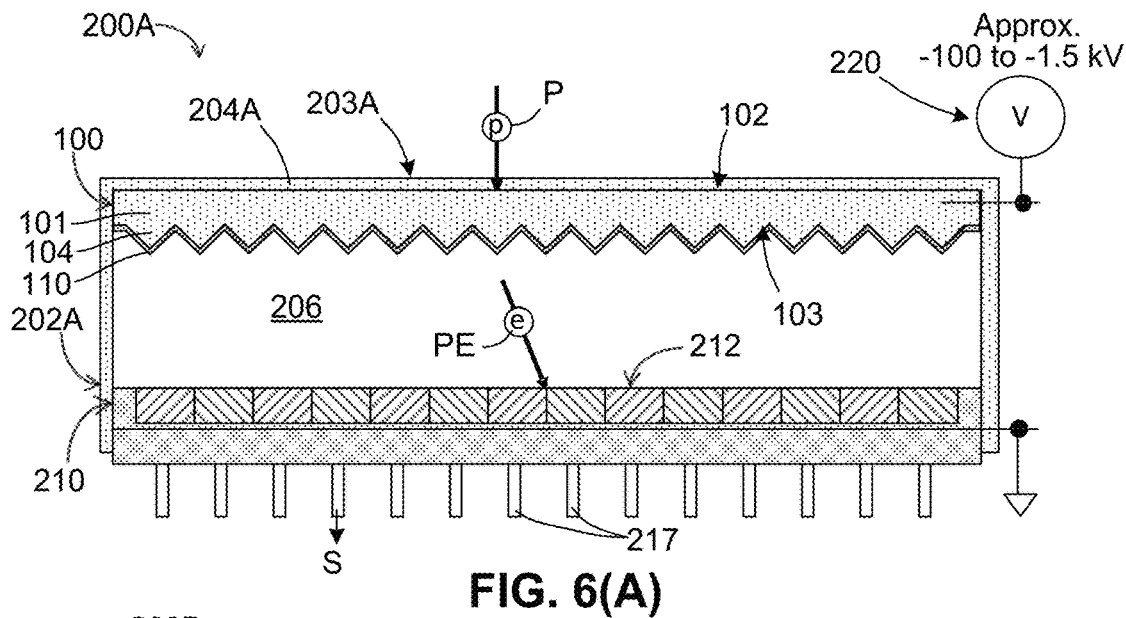
FIGS. 6(A), 6(B) and 6(C) are cross-sectional side views illustrating exemplary sensors including the photocathode according to alternative specific embodiments of the present invention.
Figure 6B:
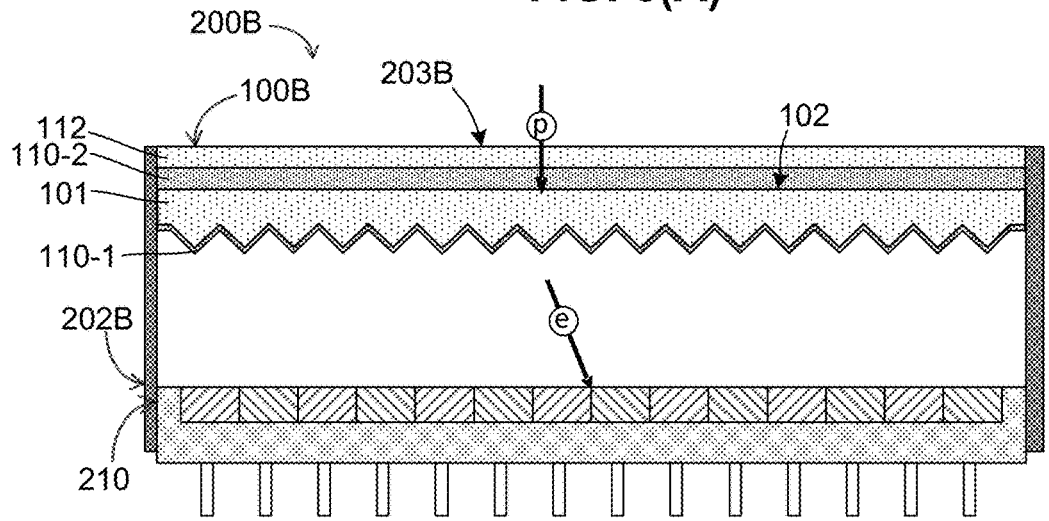
Figure 6C:
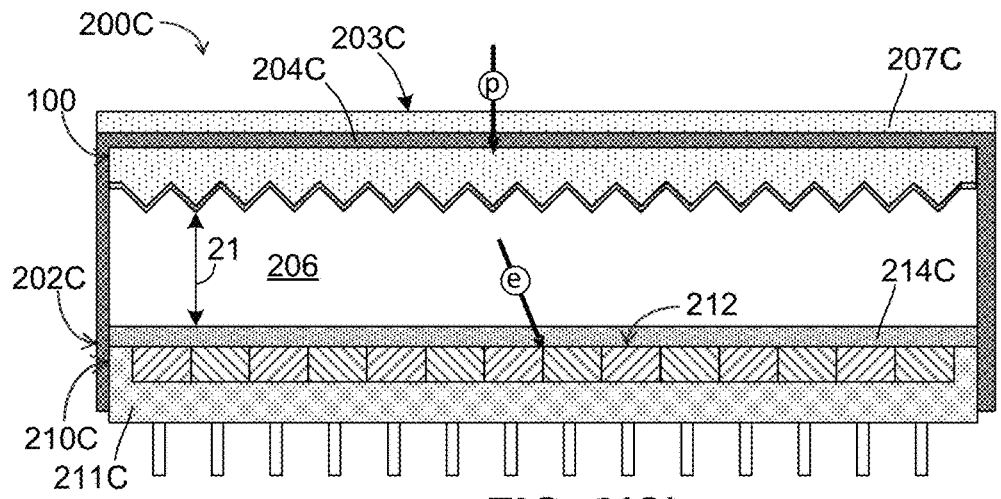

FIGS. 6(A) to 6(C) are simplified cross-sectional figures showing various sensor structures in accordance with alternative specific embodiments, where each of the sensor embodiments includes an inventive photocathode structure according to at least one of the embodiments set forth above, thereby providing sensors having superior low light sensing capability that can be utilized, for example, in semiconductor inspection systems. Although the simplified sensor structures shown in FIGS. 6(A) to 6(C) are consistent with EBCCD-type sensors, it is understood that the depicted sensor structures are applicable to other sensor structures as well (e.g., image intensifier and photomultiplier sensors).

FIG. 6(A) illustrates in cross section a sensor 200A in accordance with a first sensor embodiment of the present invention. Sensor 200A generally includes silicon photocathode 100, which is described above, a detection device 210 (e.g., a CCD or CMOS image sensor), and a housing 202A operably connected between photocathode 100 and detection device 210 such that a detecting surface 212 of detection device 210 is separated from the lower boron layer 110 of photocathode 100 by an intervening gap region 206. Photocathode 100 is disposed adjacent to a receiving surface 203A of sensor 200A and arranged such that an illuminated surface 102 faces away from detection device 210, thereby orienting photocathode 100 to receive radiation (e.g., photons P) and to emit photoelectrons PE across intervening gap region 206 to detection device 210. As set forth above with reference to FIG. 1, photocathode 100 is characterized by having emitter protrusions 104 integrally formed on output (second) surface 103 of a (e.g., monocrystalline) silicon substrate 101, and a boron (first) layer 110 disposed on output surface 103. Similar to most CCD and CMOS image sensor devices, detection device 210 includes sensing structures for detecting photoelectrons PE and circuitry for generating an electric signal S (e.g., by way of one or more output pins 217) in response to the detected photoelectrons.

According to an aspect of the illustrated embodiment, photocathode 100 is bonded or otherwise hermetically sealed to a non-conducting or highly resistive glass or ceramic window 204A that, in conjunction with side wall and other portions of housing 202A, form an envelope whose interior is evacuated (i.e., gap region 206 is essentially filled with a vacuum). In one specific embodiment, the bond between window 204A and photocathode 100 is formed by a silicon dioxide layer disposed around the edge of photocathode 100. In some embodiments, silicon substrate 101 of photocathode 100 may be a few tens of microns to a few hundred microns thick. Such thicknesses are strong enough to withstand the force of atmospheric pressure from the outside without any window on top of photocathode. Materials suitable for use in forming window 204A include fused silica, quartz, alumina (sapphire), magnesium fluoride and calcium fluoride.

According to another aspect of the first sensor embodiment, sensor 200 includes conductive structures (e.g., similar to the grid structure described above with reference to FIG. 2(E) and FIG. 2(F)) that are operably disposed on or adjacent to photocathode 100 and detection device 210 such that, when a suitable voltage supply 220 is operably coupled to sensor 200A, an electric field is generated between photocathode 100 and detection device 210 that serves to accelerate electrons 112 emitted from photocathode into gap region 206 toward detection device 210. In some embodiments, as explained above with reference to FIG. 2(E) and FIG. 2(F), output surface 103 of photocathode 100 is held at a positive potential relative to the illumination surface 102 by a second voltage source (not shown). Electrons are emitted by the photocathode 100 when radiation (photons) is absorbed, and photoelectrons emitted into gap region 206 are accelerated towards detection device 210 because the photocathode 110 is held at a negative potential relative to detection device 210 by voltage source 220. In preferred embodiments the potential difference generated by voltage source 220 is in a range of approximately 100 V to approximately 1500 V.

FIG. 6(B) shows a sensor 200B according to a second sensor embodiment including photocathode 100D, a detection device 210B (e.g., a CCD or a CMOS image sensor) formed on a (second) silicon substrate 211C), and a housing 202 that maintains photocathode 100B at a fixed distance from detection device 210B. As described above with reference to FIG. 2(D), photocathode 100D is characterized by including second boron layer (third layer) 110-2 disposed directly on illuminated (first) surface 102 of silicon substrate 101, and an anti-reflective material (fourth) layer 112 disposed on second boron layer 110-2. In this embodiment, housing 202B does not include a window disposed above photocathode 100, so receiving surface 203B of sensor 200B is formed by an outer (upper) surface of anti-reflective material (fourth) layer 112. Sensor 200B thus has the advantage of being more sensitive (i.e., able to detect lower amounts of light) than sensors with a window owing to no losses due to reflection or absorption by the window. As such, sensor 200B exhibits a relatively high sensitivity from near infrared wavelengths to X-ray wavelengths.

FIG. 6(C) shows a sensor 200C according to a third sensor embodiment including photocathode 100 and a silicon-based detection device 210C (e.g., a CCD or a CMOS image sensor formed on a (second) silicon substrate 211C) that is secured to a housing 202C in a manner similar to that described above with reference to FIG. 6(A).

According to an aspect of the third sensor embodiment, housing 202C includes an upper window portion 204C that is disposed over photocathode 100, and an anti-reflective material layer 207C is formed on window 204C in order to improve photon capture by sensor 200C. In an alternative embodiment, an additional anti-reflective material layer (not shown) is disposed between photocathode 100 and window 204C (i.e., photocathode 100 is implemented using, for example, photocathode 100D, which is described above with reference to FIG. 4C).

In accordance with another aspect of the third sensor embodiment, a (third) boron coating layer 214C is formed directly on a detecting (upper) surface 212 of image sensor 210C using the techniques described above with reference to photocathode 100 to enable efficient absorption of electrons by image sensor 210C that are emitted from photocathode 100. In preferred embodiments, a gap distance G between photocathode 100 and image sensor 210C is between approximately 100 μm and approximately 1 mm. Because boron coating layer 214C improves the efficiency of image sensor 210C for low-energy electrons, a lower accelerating voltage and smaller gap may be used than is typical in prior art devices. The advantage of the lower accelerating voltage and smaller gap is that the spatial resolution of the sensor is improved and the response time is reduced (i.e., the maximum operating frequency is increased). Thermalization of the photoelectrons within the silicon photocathode also improves the spatial resolution of the image sensor.

In other embodiments of the invention, a wafer, reticle or photomask inspection system includes an illumination source (e.g., a laser system) for transmitting light (photons) onto a sample/wafer, a sensor (e.g., a photomultiplier, an image intensifier or an EBCCD) that utilizes any of the inventive photocathodes described above to detect photons passing through or reflected by the sample/wafer, and an associated optical system for guiding the light/photons from the illumination source to the sample (wafer, reticle or photomask), and from the sample to the sensor. Examples of these embodiments are shown in FIGS. 6 through 10.

Figure 7:
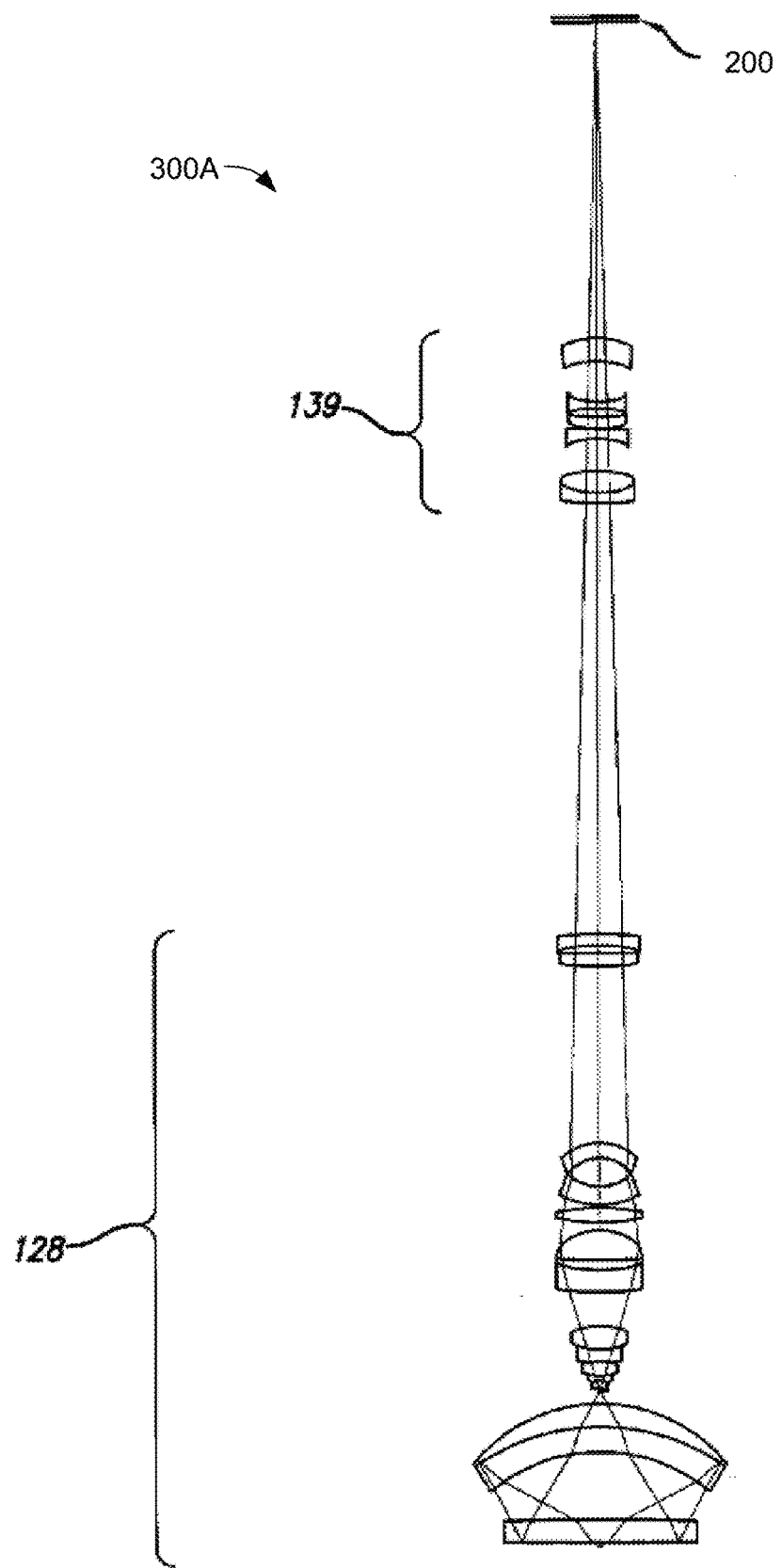
FIG. 7 is a simplified diagram showing an inspection system according to another embodiment of the present invention.

FIG. 7 shows key components of an inspection system 300A with dark-field and bright field inspection modes. The optics utilized by system 300A comprise a high numerical aperture large field-of-view objective lens 128, tube lens 139 for setting or adjusting the magnification and a detector 200, which incorporates a photocathode constructed in accordance with any of the embodiments described above. When operating in dark-field mode the detector 200 incorporates the inventive photocathode in an EBCCD or image intensifier arrangement similar to that shown in any of FIGS. 6(A) to 6(C). More details on other aspects of this inspection system can be found in U.S. Pat. No. 7,345,825, which is incorporated herein by reference in its entirety.

FIGS. 8(A) to 8(D) illustrate aspects of dark-field inspection systems that incorporate the inventive photocathode in accordance with other exemplary embodiments of the present invention. In FIG. 8(A), inspection system 300B-1 illuminates line 18 by light 14 that is passed through optics 11 comprising lens or mirror 12 onto the surface 20 of the wafer or photomask (sample) being inspected. Collection optics 21 direct scattered light from that line to sensor 200 using lenses and/or mirrors such as 22a and 22b. The optical axis 28 of the collection optics is not in the illumination plane of line 18. In some embodiments, axis 28 is approximately perpendicular to the line 18. Sensor 200 is an array sensor, such as a linear array sensor, incorporating the inventive photocathode, for example, in accordance with the embodiments illustrated in any of FIGS. 6(A), 6(B) and 6(C). FIGS. 8(B), 8(C) and 8(D) illustrate alternative arrangements of multiple dark-field collection systems (300B-2, 300B-3 and 300B-4, respectively) that incorporate a detector 200 with the inventive photocathode in combination with line illumination such as that shown in FIG. 8(A). More details of these inspection systems can be found in U.S. Pat. No. 7,525,649, which is incorporated herein by reference in its entirety. U.S. Pat. No. 6,608,676, which is also incorporated herein by reference in its entirety, also describes line illumination systems suitable for inspection of unpatterned or patterned wafers.

Figure 9:
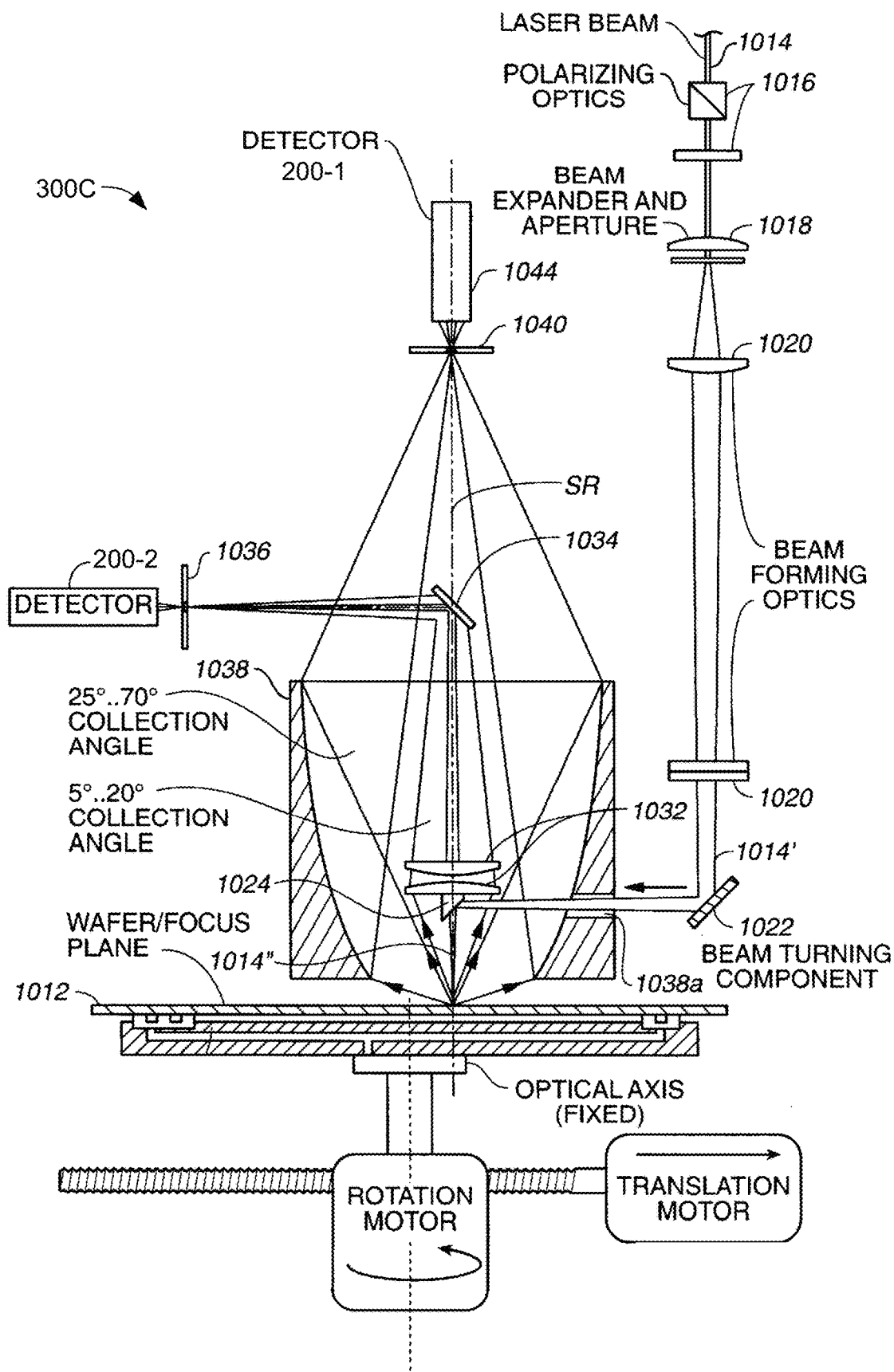
FIG. 9 is a simplified diagram showing another inspection system according to another embodiment of the present invention.

FIG. 9 shows an unpatterned wafer inspection system 300C that incorporates the inventive photocathode in accordance with another exemplary embodiment of the present invention. Light from laser 1014 is directed to wafer 1012 by means of polarizing optics 1016, beam forming optics 1020 and turning mirrors such as 1022 and 1024. Light scattered from the wafer is collected by mirrors and lenses such as 1038 and 1032 and sent to detectors 200-1 and 200-2, which incorporate a photocathode constructed in accordance with any of the embodiments described above. In some embodiments, detectors 200-1 and 200-2 comprise photomultiplier tubes incorporating the inventive photocathode. More details on unpatterned wafer inspection systems can be found in U.S. Pat. No. 6,271,916, which is incorporated herein by reference in its entirety.

Figure 10:
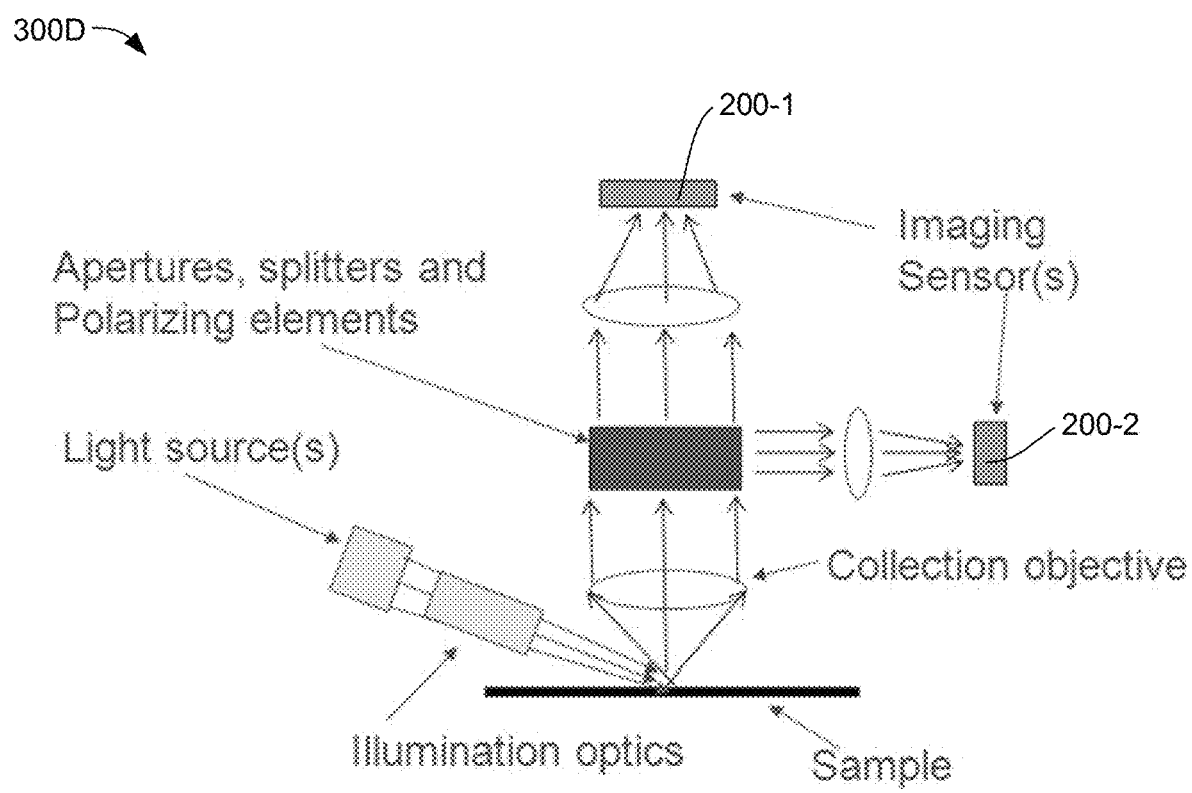
FIG. 10 is a simplified diagram showing another inspection system according to another embodiment of the present invention.

FIG. 10 shows a flood-illumination wafer inspection system 300D in accordance with another alternative embodiment of the present invention. An area of a wafer (sample) is illuminated by an off-axis light source. Light scattered from the wafer is collected by the collection objective, passes one or more apertures, splitters and polarizers and then is directed to one or more image sensors 200-1 and 200-2, which incorporate a photocathode constructed in accordance with any of the embodiments described above. In some embodiments, image sensors 200-1 and 200-2 comprise an EBCCD or an image intensifier incorporating the inventive photocathode. More details of this inspection system can be found in co-owned and copending U.S. patent application Ser. No. 13/544,954 (published as 2013/0016346) entitled "Wafer Inspection" by Romanovsky et al., which is incorporated herein by reference in its entirety. In these inspection system embodiments, the wafer is preferably continuously moving during the inspection. The image sensor used in this embodiment of the invention can advantageously incorporate any of the techniques described in co-owned and co-pending U.S. patent application Ser. No. 13/710,315 (published as 2013/0148112) entitled "Electron-Bombarded Charge-Coupled Device And Inspection Systems Using EBCCD Detectors", and co-owned and co-pending U.S. patent application Ser. No. 14/096,911 (published as 2014/0158864) entitled "Method and apparatus for high-speed acquisition of moving images using pulsed illumination", both of which are incorporated herein by reference in their entirety.

Figure 11:
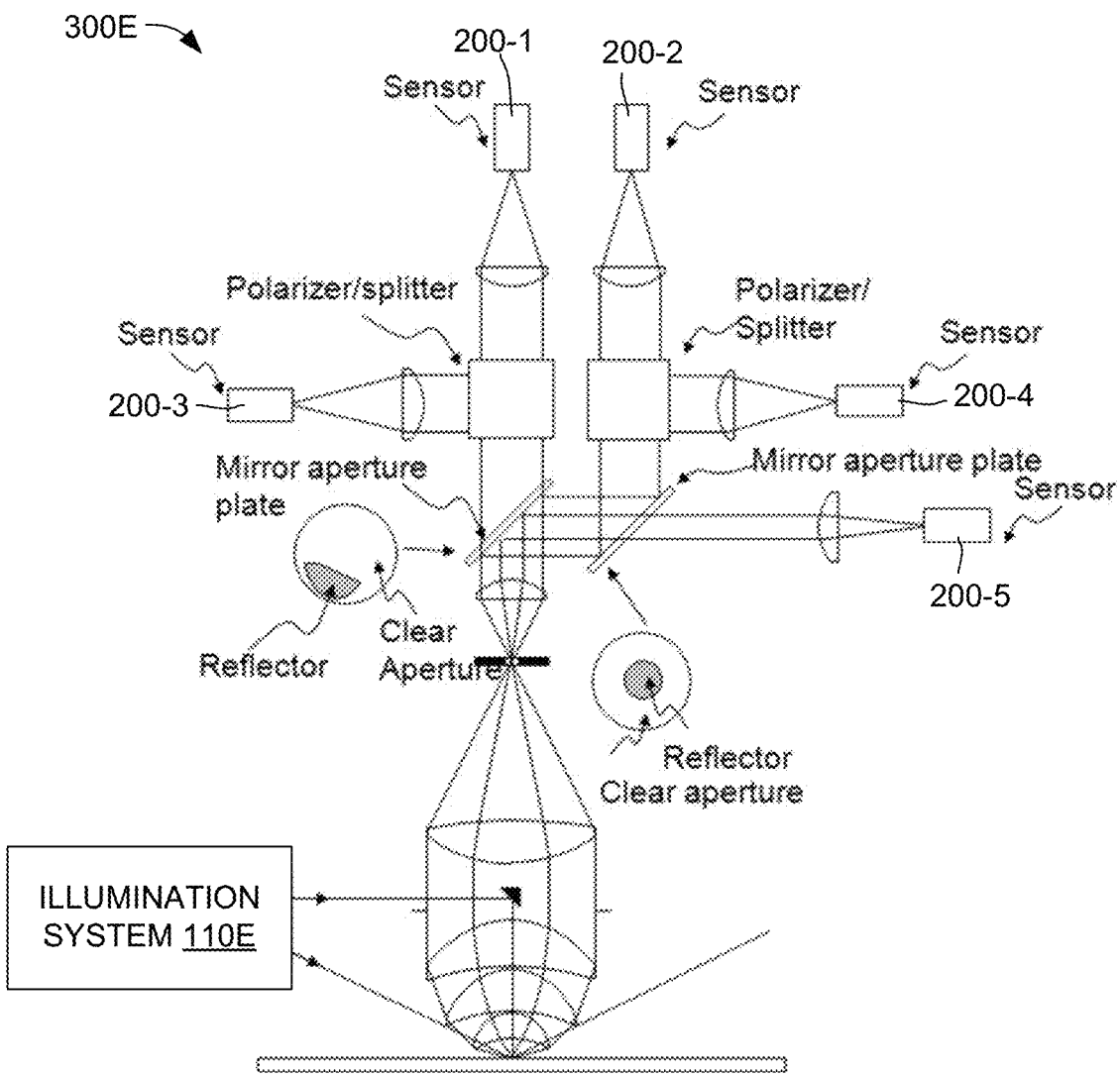
FIG. 11 is a simplified diagram showing another inspection system according to another embodiment of the present invention.
Figure 12:
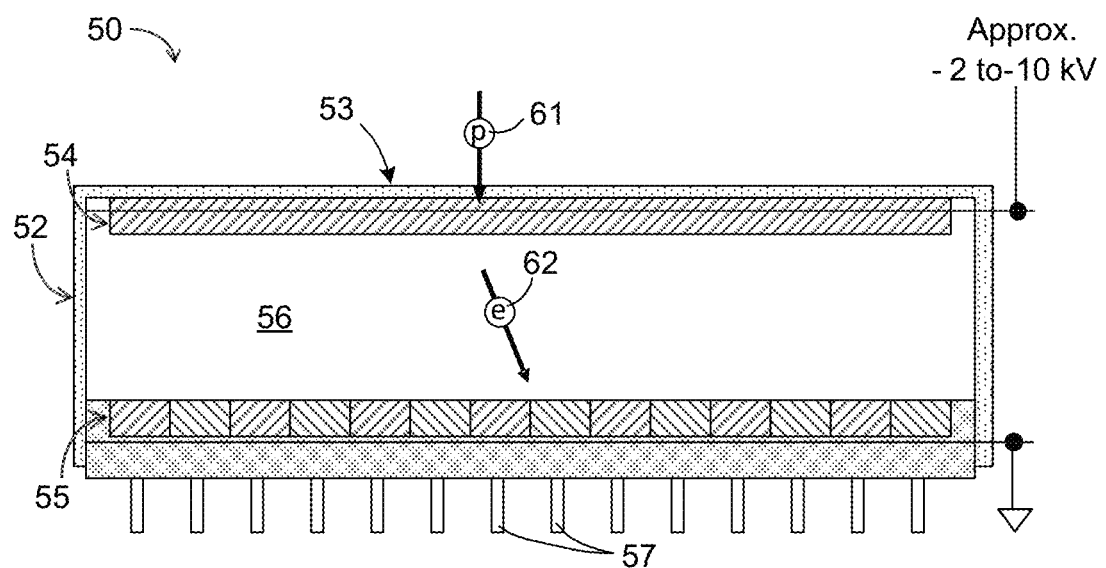
FIG. 12 is a cross-sectional side view illustrating a conventional sensor.

FIG. 11 shows a wafer inspection system 300E in accordance with another alternative embodiment of the present invention. Inspection system 300E includes an illumination subsystem 110E that provides oblique illumination and substantially normal illumination by way of the illustrated optical system, which collects the scattered light and directs that light through various apertures and polarizing beam splitters to multiple sensors 200-1 to 200-5, which incorporate the inventive photocathode in accordance with any of the embodiments described above. More details of wafer inspection system 300E and other aspects of wafer inspection systems that can advantageously use detectors incorporating the photocathodes disclosed herein can be found in U.S. patent application Ser. No. 13/822,281 entitled "Wafer Inspection", filed on Dec. 7, 2011 by Zhao et al., and incorporated by reference herein.

Prior-art image intensifiers and electron-bombarded CCDs have to compromise between sensitivity and spectral bandwidth. At best, good sensitivity is possible only for a narrow range of wavelengths. This invention, by enabling the use of silicon as a photocathode, allows high sensitivity over a wider range of wavelengths. Furthermore, because of the high efficiency and high current emission of the inventive photocathode, image intensifiers, photomultipliers and electron-bombarded CCDs can, in some embodiments, operate with lower accelerating voltages, which in turn improves device lifetime, and increases the maximum operating frequency and/or spatial resolution.

Prior-art silicon photocathodes have an oxide layer on each surface, which impedes the escape of photoelectrons and results in low efficiency. By forming a boron layer on the output surface of the silicon allows electrons to escape more easily resulting in higher efficiency. The field emitter array on the surface further enhances the efficiency.

An image sensor that combines the inventive photocathode with a boron-coated CCD or CMOS image sensor exhibits higher quantum efficiency in the photocathode combined with the increased sensitivity of the boron-coated CCD.

Dark-field inspection systems incorporating detectors with the inventive photocathode have a combination of high efficiency, very low noise level and high-speed operation that is not achievable with conventional image and light sensors.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A photocathode comprising:
   a silicon substrate having opposing first and second surfaces and including a plurality of integral field emitter protrusions, each said field emitter protrusion having fixed portion integrally formed on the silicon substrate and extending from said second surface to a tip portion, and
   a substantially pure boron layer hermetically disposed at least on the tip portion of each said field emitter protrusion,
   wherein the photocathode does not include a low work-function material, whereby electrons leaving said photocathode through said tip portions only pass through said substantially pure boron layer.

2. The photocathode of claim 1, wherein said substantially pure boron layer has a thickness in the range of approximately 1 nm to 5 nm.

3. The photocathode of claim 2,
   wherein the first surface is entirely disposed on a p-doped region of said silicon substrate, and said second surface and said plurality of field emitter protrusions are entirely disposed on an n-doped region of said silicon substrate, and
   wherein said p-doped region and said n-doped region are configured to form a p-i-n photodiode operating in an avalanche multiplication condition when an external potential difference of at least 100 volts is applied across the silicon substrate.

4. The photocathode of claim 1, further comprising a second substantially pure boron layer disposed directly on the first surface of the silicon substrate.

5. The photocathode of claim 4, further comprising an anti-reflective layer disposed on the second substantially pure boron layer.

6. The photocathode of claim 1, wherein the silicon substrate further comprises dopants configured such that, during operation of said photocathode, each said field emitter protrusion operates as a field emitter in a reverse bias mode.

7. The photocathode of claim 1, wherein the plurality of field emitter protrusions are arranged in a two-dimensional periodic pattern on said second surface.

8. The photocathode of claim 1, wherein each said field emitter protrusion comprises a pyramid-shaped structure.

9. The photocathode of claim 1, wherein each said field emitter protrusion comprises one of a rounded cone-shaped structure and a rounded whisker-shaped structure.

10. The photocathode of claim 1, further comprising at least one gate structure disposed over the output surface and positioned adjacent to and spaced from the tip portion of at least one of said plurality of field emitter protrusions.

11. The photocathode of claim 1, further comprising conductive structures configured to apply an external potential difference across the silicon substrate.

12. The photocathode of claim 1, wherein the silicon substrate includes a p-type gradient diffusion region extending from the first surface toward the second surface such that the p-type gradient diffusion region has a higher p-type dopant concentration in portions of the silicon substrate located near the first surface than in portions of the silicon substrate disposed away from the first surface.

13. A sensor for generating an electric signal in response to photons directed onto a receiving surface of said sensor, the sensor comprising:
   a photocathode disposed adjacent to the receiving surface and configured to emit photoelectrons in response to said photons passing through said receiving surface and into said photocathode, the photocathode including:
      a silicon substrate having opposing first and second surfaces and including a plurality of integral field emitter protrusions, each said field emitter protrusion having fixed portion integrally formed on the silicon substrate and extending from said second surface to a tip portion, and
      a substantially pure boron layer hermetically disposed at least on the tip portion of each said field emitter protrusion;
   a detection device having a detecting surface facing the second surface of said photocathode, said detection device configured to detect said photoelectrons emitted by said photocathode, and configured to generate said electric signal in response to said detected photoelectrons; and
   a housing operably connected between the photocathode and the detection device such that the detecting surface of the detection device is separated from the photocathode by an intervening gap region that extends entirely between an exposed outer surface of the substantially pure boron layer and the detecting surface of the detection device.

14. The sensor of claim 13, further comprising a second substantially pure boron layer disposed directly on the first surface of the silicon substrate.

15. The sensor of claim 14, further comprising an anti-reflective layer disposed directly on the second substantially pure boron layer.

16. The sensor of claim 15, wherein the receiving surface of the sensor comprises an outer surface of the anti-reflective material.

17. The sensor of claim 13, wherein the silicon substrate further comprises implanted dopants configured such that, during operation of said photocathode, each said field emitter protrusion operates as a field emitter in a reverse-bias mode.

18. The sensor of claim 17, wherein the plurality of field emitter protrusions are arranged in a two-dimensional periodic pattern on said second surface.

19. The sensor of claim 13, wherein said substantially pure boron layer has a thickness in the range of approximately 1 nm to 5 nm.

20. The sensor of claim 13, wherein said sensor comprises one of an image intensifier, an electron-bombarded charge-coupled device (EBCCD) and a photomultiplier.

21. The sensor of claim 13, wherein each said field emitter protrusion comprises one of a rounded cone-shaped structure and a rounded whisker-shaped structure.

22. The sensor of claim 13, wherein each said field emitter protrusion comprises a pyramid-shaped structure.

23. The sensor of claim 13, further comprising at least one gate layer placed at approximately the same height as the field emitter tips.

24. The sensor of claim 13, wherein the receiving surface comprises a layer of anti-reflective material disposed on a first surface of a window, and the silicon substrate is disposed on an opposing second surface of the window.

25. The sensor of claim 13, wherein the detection device comprises a second silicon substrate and includes a boron layer disposed directly on the detecting surface of the second silicon substrate.

26. An inspection system comprising:
  an illumination source configured to transmit directed photons;
  a sensor configured to detect redirected photons; and
  an optical system configured to guide the directed photons from the illumination source to a sample, and to guide redirected photons from the sample to the sensor,
  wherein the sensor comprises:
    a photocathode configured to emit photoelectrons in response to said redirected photons, the photocathode including:
      a silicon substrate having opposing first and second surfaces and including a plurality of integral field emitter protrusions, each said field emitter protrusion having fixed portion integrally formed on the silicon substrate and extending from said second surface to a tip portion, and
      a substantially pure boron layer hermetically disposed at least on the tip portion of each said field emitter protrusion and having an exposed outer surface that faces away from said silicon substrate; and
    a detection device having a detecting surface separated by a gap from said photocathode such that said gap extends entirely between said exposed outer surface of the substantially pure boron layer and said detecting surface, said detection device configured to detect said photoelectrons emitted by said photocathode, and configured to generate an electric signal in response to said detected photoelectrons.

27. The inspection system of claim 26, wherein said sensor comprises one of an image intensifier, an electron-bombarded charge-coupled device (EBCCD) and a photomultiplier.

* * * * *